US012731657B2

(12) United States Patent
Tian et al.

(10) Patent No.: US 12,731,657 B2
(45) Date of Patent: Sep. 8, 2026

(54) READ RETRY WITH PHYSICAL DEFECT JUDGEMENT

(71) Applicant: Sandisk Technologies, Inc., Milpitas, CA (US)

(72) Inventors: Xuan Tian, Shanghai (CN); Liang Li, Shanghai (CN); Ming Wang, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 112 days.

(21) Appl. No.: 18/935,004

(22) Filed: Nov. 1, 2024

(65) Prior Publication Data

US 2026/0128115 A1 May 7, 2026

(51) Int. Cl.

*G11C 16/16* (2006.01)
*G11C 16/08* (2006.01)
*G11C 29/02* (2006.01)
*G11C 29/52* (2006.01)

(52) U.S. Cl.

CPC .............. *G11C 29/52* (2013.01); *G11C 16/08* (2013.01); *G11C 29/022* (2013.01); *G11C 16/16* (2013.01)

(58) Field of Classification Search

CPC ...................................................... G11C 16/16
See application file for complete search history.

(56) References Cited

U.S. PATENT DOCUMENTS 8,305,807 B2 11/2012 Shah et al.
8,432,732 B2 4/2013 Li et al.
9,483,370 B2 11/2016 Reche et al.
9,529,663 B1 12/2016 Srinivasan et al.
9,558,847 B2 1/2017 Tuers et al.
9,748,001 B2 8/2017 Li et al.
10,991,444 B1 4/2021 Bazarsky et al.
11,482,296 B2 10/2022 Alrod et al.
2013/0332801 A1 12/2013 Weng et al.
2017/0229186 A1 8/2017 Karakulak et al.
2018/0107540 A1 4/2018 Lee et al.
2021/0166774 A1* 6/2021 Cha ........................ G11C 16/16
2021/0264980 A1 8/2021 Sagron et al.
2021/0357289 A1 11/2021 Kurose et al.

OTHER PUBLICATIONS

International Search Report & The Written Opinion of the Searching Authority dated Aug. 13, 2025, International Application No. PCT/US2025/026930.

* cited by examiner

*Primary Examiner* — Jason Lappas
(74) *Attorney, Agent, or Firm* — Pearl Cohen LLP

(57) ABSTRACT

Technology for retrying failed reads of non-volatile memory such as NAND. The memory system retries the failed read using one or more different read techniques than the failed read until the read is successful. The memory system may use different read reference voltages for read retries than the read reference voltages used in the failed read. After a successful read retry the memory system determines whether the original read failed due to an inherent reliability issue or a physical defect. If there is a physical defect the memory cells may be retired. In an embodiment, the entire block of memory cells having the physical defect is retired. However, if the read failed due to an inherent reliability issue then the memory cells may continue to be used.

15 Claims, 20 Drawing Sheets

Storage System 100
Memory Controller 120
130
Storage
160
Memory Interface
158
ECC Engine
156
Processor
154
NOC
164
Local Memory Controller
Defect Judgement
132
140
local memory
152
Host Interface
102
Host 207
211
201
memory structure 202
208
206
row control circuitry 220
row decoder 222
array drivers 224
block select 226
column control circuitry 210
column decoder 212
driver circuitry 214
block select 216
R/W Circuits 225
Control Die
row address signals
control signals
control signals
column address signals
System Control Logic 260
State Machine 262
Storage 266
Power Control 264
Interface 268
Memory Controller 207
201
280
282
282
276
211
284
284
278
201
282
282
276
211
284
284
280
278
201
282
282
276
211
284
280
278
271
274
272

To NAND strings
BL3
BL2
BL1
BL0
225
225
225
225
325
Comparison circuit 320
Sense node latch 322
Managing Circuit 330
346
340
ADL
BDL
CDL
336
352
348
XDL
I/O Interface 332
334
Data

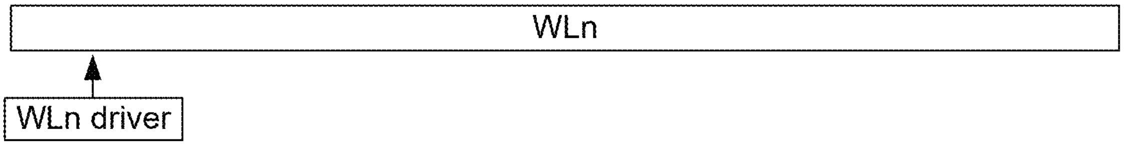
Figure 4F1
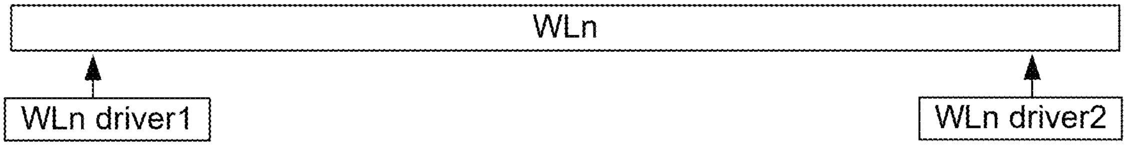
Figure 4F2
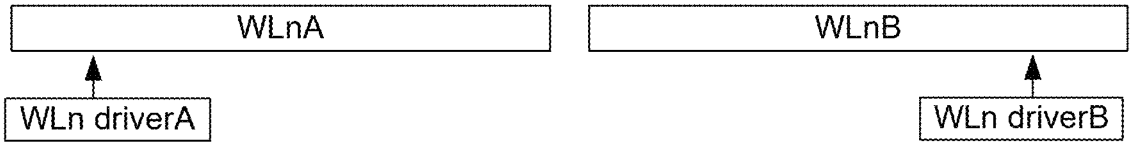
Figure 4F3 of memory cells
E
P
Vt
Vr
Vev
Vv
Er
A
B
C
D
E
F
G
Vt
VvA
VvB
VvC
VvD
VvE
VvF
VvG
Vev
VrA
VrB
VrC
VrD
VrE
VrF
VrG

READ RETRY WITH PHYSICAL DEFECT JUDGEMENT

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

Modern storage systems such as, for example, solid state drives typically contain a number of semiconductor dies with each die containing memory cells such as NAND strings. Each die may contain one or more planes with each plane containing a large number of blocks. Each block contains a large number of memory cells such as NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block. The block is associated with a source line. The source side select gates are used to connect or disconnect the NAND channels from the source line.

The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell. At the end of a successful programming process, each memory cell's Vt should be within one of a number of Vt distributions.

Once the memory cells in the memory device have been programmed, data may be read from the memory cells by sensing the programmed states of the memory cells. However, sensed states can sometimes vary from the written states due to one or more factors. Error detection and correction decoding can be used to detect and correct data errors resulting from sensed states that do not match written states. Typically, the user data is encoded as ECC (error correction code) codewords prior to programming. Therefore, an ECC engine may be used to correct errors in the encoded user data. However, there is a limit as to how many bits in the data read from the memory cells can be in error in order for the ECC algorithm to successfully correct all errors. Therefore, storage systems typically do not rely only on correcting errors in ECC codewords. Many storage systems employ one or more techniques to recover from read failures such as the failure to decode ECC codewords programmed into that block. One technique to recover from a read failure is to dynamically adjust (i.e., calibrate) the read reference voltages and then retry the read of the memory cells with the calibrated read reference voltages. The read reference voltages can be calibrated using a number of different techniques.

One reason for a read failure is due to intrinsic reliability issues. Over time the amount of charge that is stored in the charge storage region of the memory cell may change, thereby leading to a change in the Vt of the memory cell. The amount of charge could change due to program disturb, read disturb, or simply charge leakage over time. Program disturb refers to the unintended change to the Vt of a memory cell when programming a different cell. Read disturb refers to the unintended change to the Vt of a memory cell when reading that cell or a different cell. Charge leakage over time is referred to a data retention issue and more briefly "data retention" (DR).

Another reason for a read failure is due to a physical defect associated with the block containing the memory cells. Example physical defects include, but are not limited to, shorts such as word line to word line shorts, word line to memory cell shorts, etc. If such physical defects are detected prior to shipping the device to the customer, the block having the physical defect can be retired. However, physical defects can develop (e.g., grow) over time. It is important to detect a growing physical defect early prior to the physical defect leading to a read error that the memory system has difficulty recovering from or is unable to recover from.

BRIEF DESCRIPTION OF THE DRAWINGS

Like-numbered elements refer to common components in the different figures.

FIG. 4F1,4F2, and 4F3 depict several examples of how word lines in a block may be driven by word line drivers.

DETAILED DESCRIPTION

Technology is disclosed for retrying failed reads of non-volatile memory such as NAND. The memory system retries the failed read using one or more different read techniques than the failed read until the read is successful. The memory system may use different read reference voltages for read retries than the read reference voltages used in the failed read. After a successful read retry the memory system determines whether the original read failed due to an inherent reliability issue or a physical defect. If there is a physical defect the memory cells may be retired. In an embodiment, the entire block of memory cells having the physical defect is retired. However, if the read failed due to an inherent reliability issue then the memory cells may continue to be used.

Figure 1:
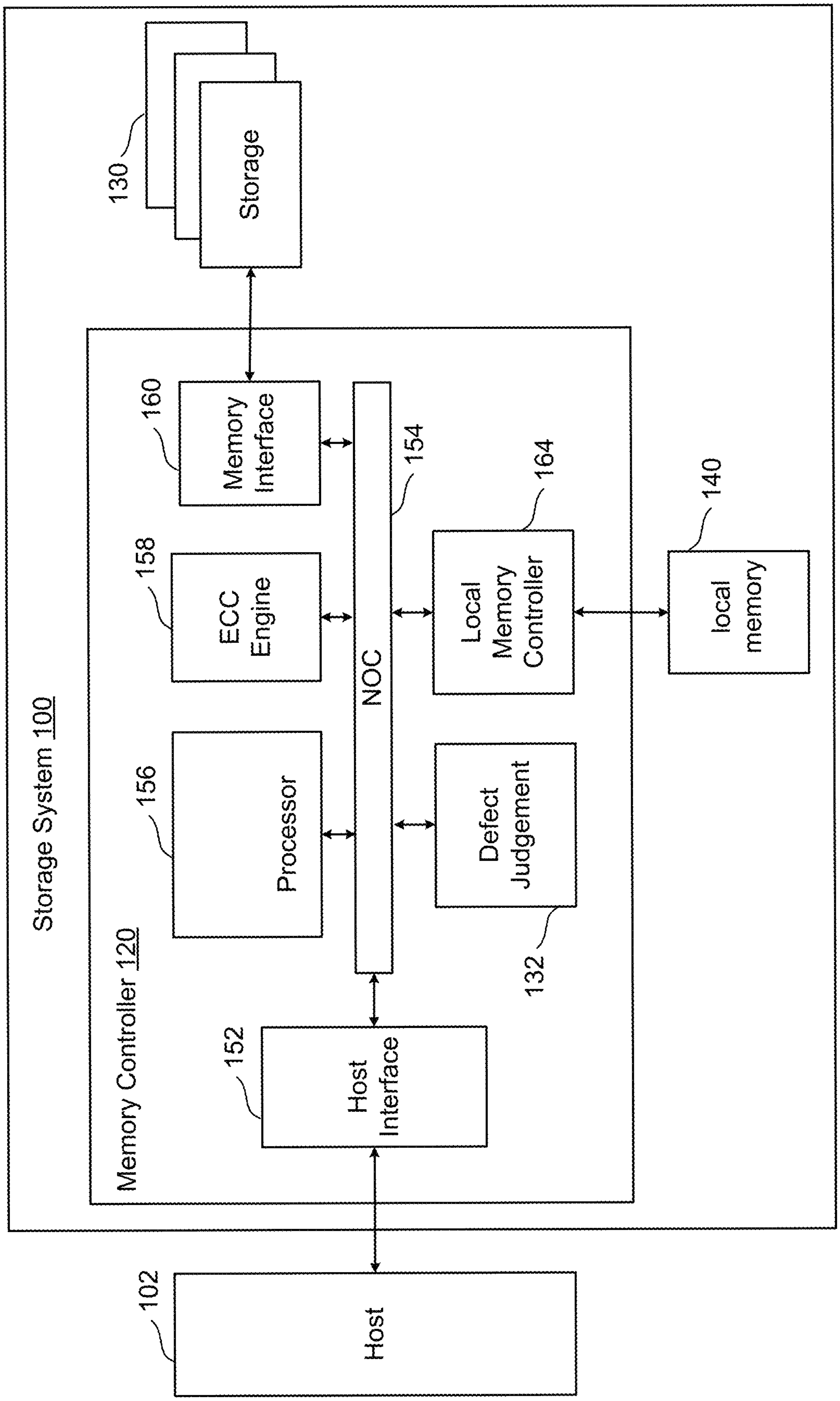
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

The defect judgement 132 determines whether there is a physical defect that impacts a group (e.g., block) of memory cells. The defect judgement 132 may be operated following a successful read retry. If the defect judgement 132 determines that there is a physical defect in the block the block may be retired, thereby preventing further complications (e.g., difficult error recoveries, errors that cannot be recovered from) were the block continued to be used. The defect judgement 132 may be implemented as software, hardware, or a combination of software and hardware. In an embodiment, the defect judgement 132 is implemented by the processor 156.

Figure 2A:
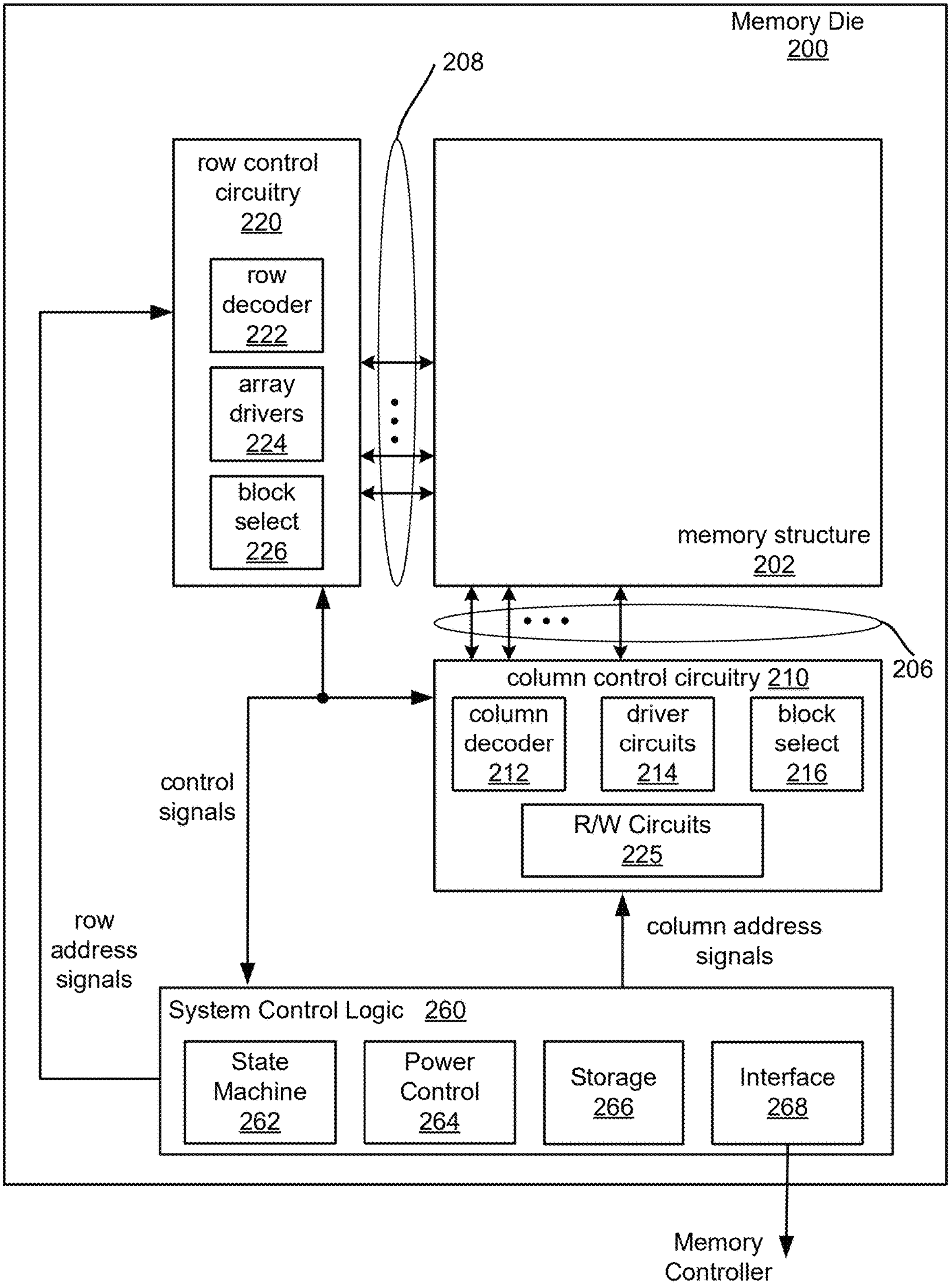
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuity 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe-Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
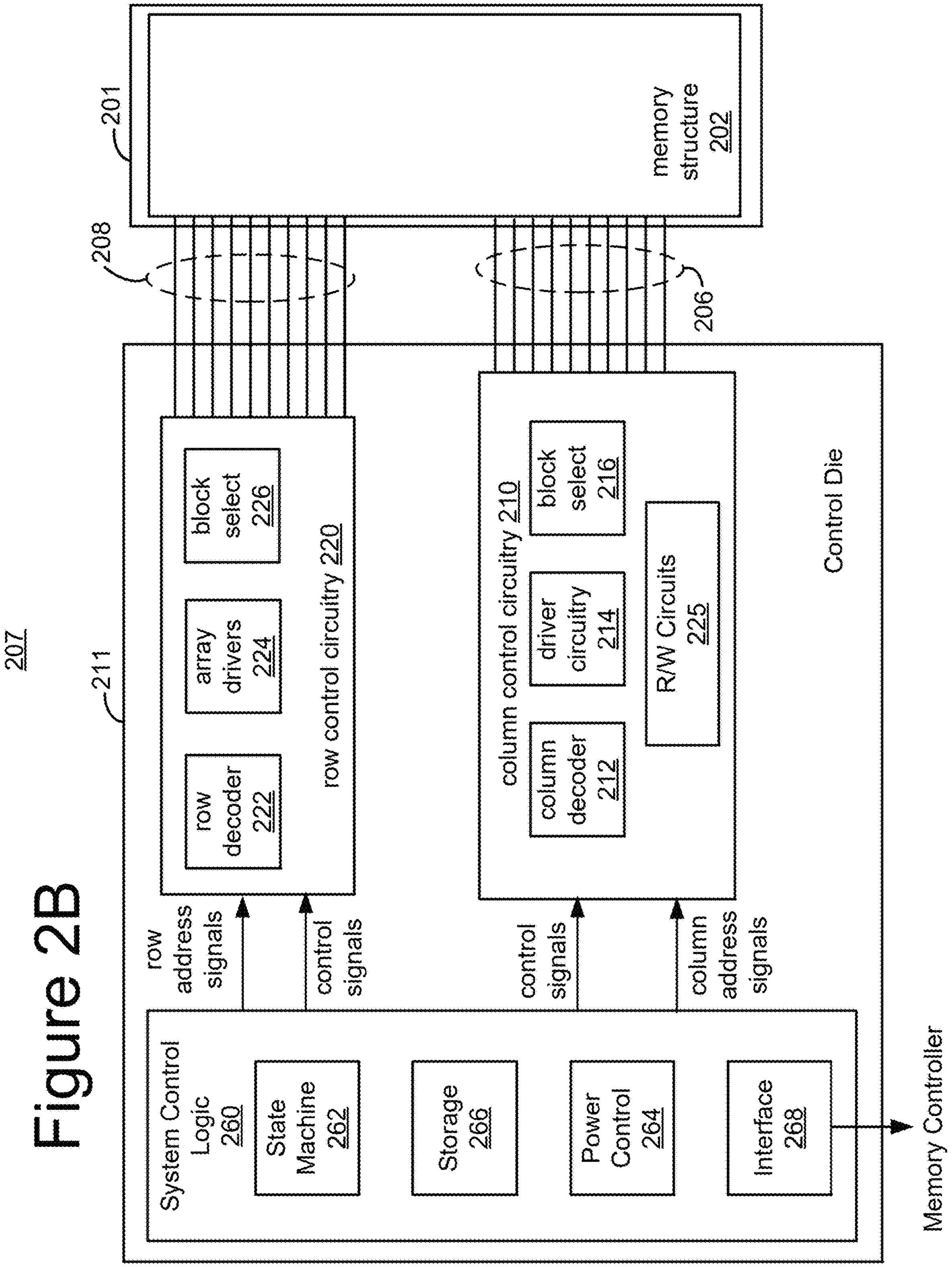
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
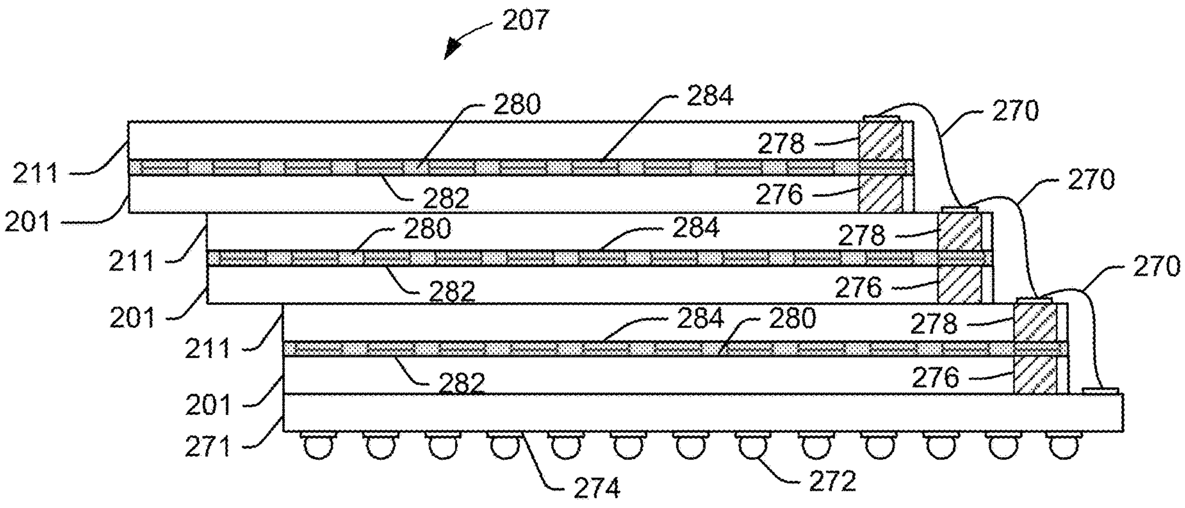
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
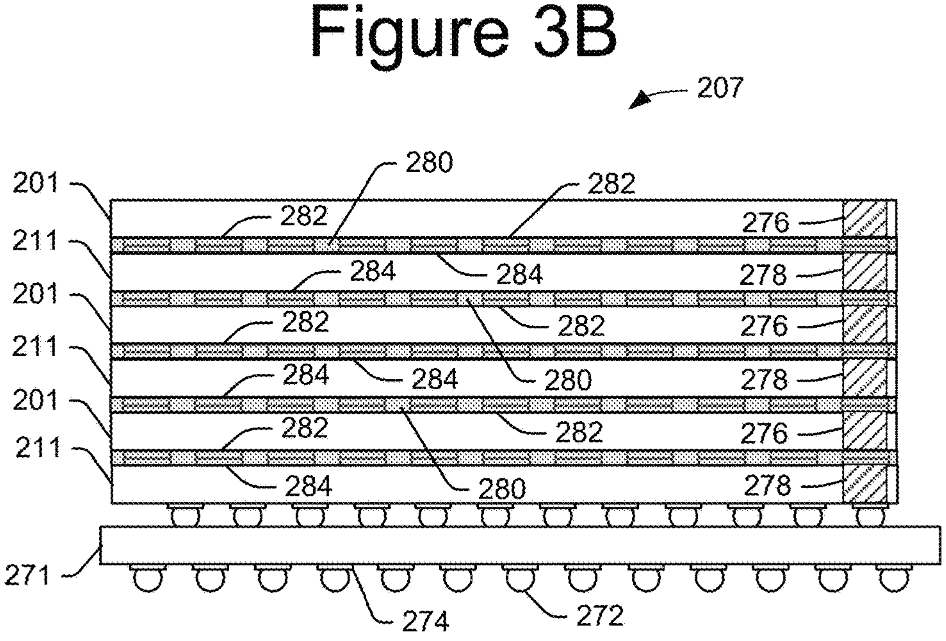

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
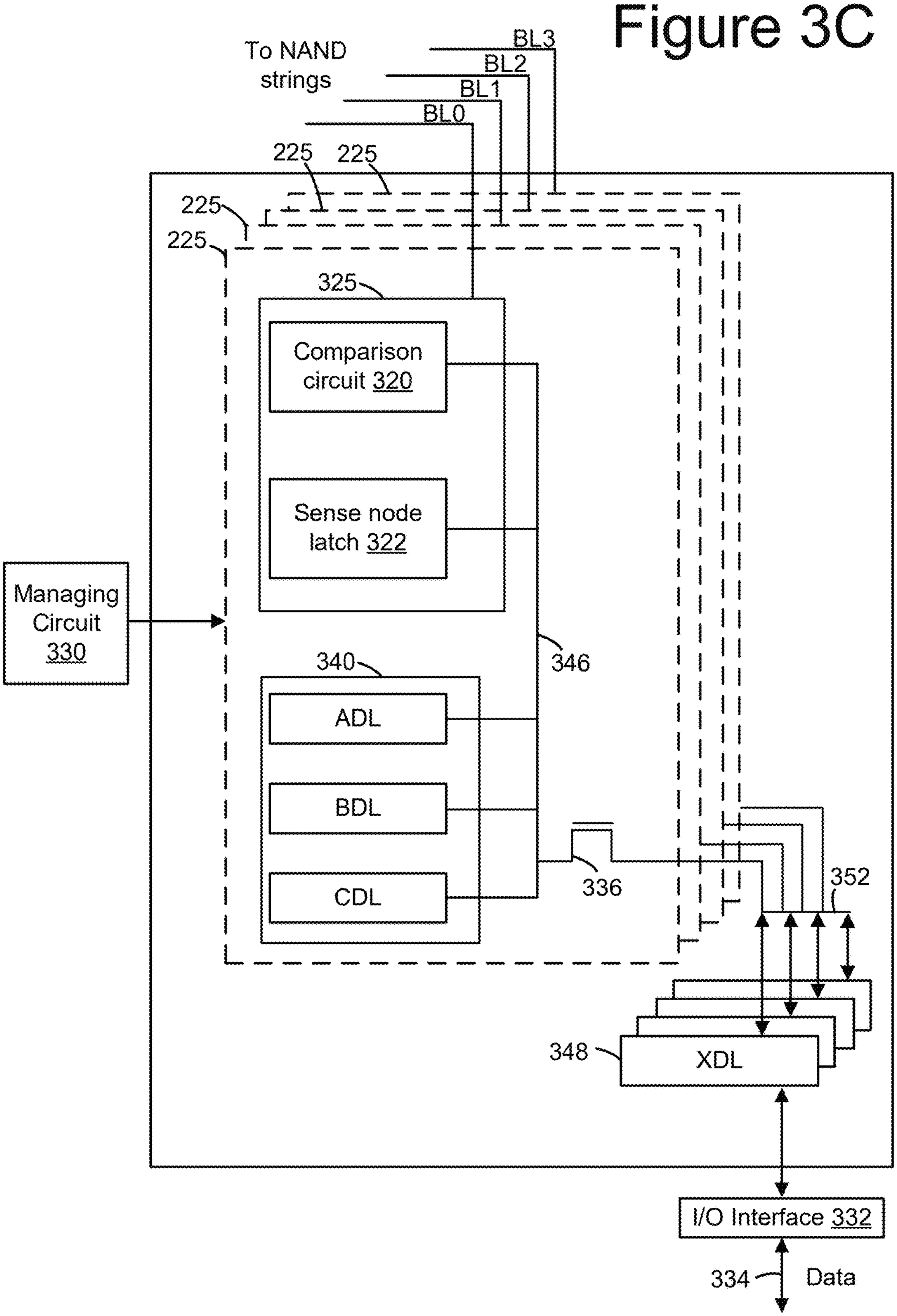
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node (SEN) is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation. The sense node latch 322 may also be referred to as "SDL".

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
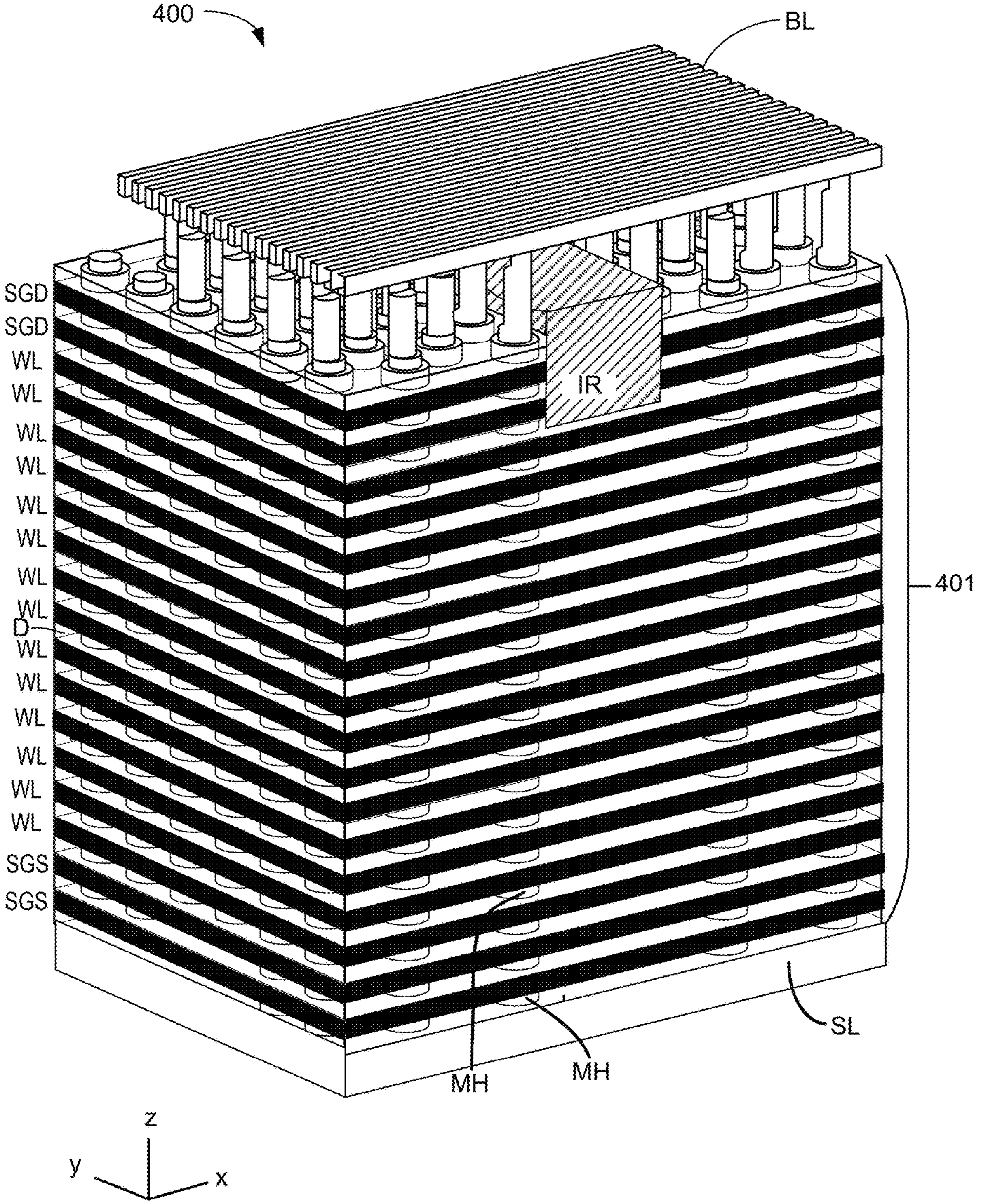
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of: SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of "sub-blocks." Each of these "sub-blocks" has many NAND strings. In an embodiment, an isolation region (IR) divides the SGD layers into multiple SGD select lines, each of which is used to select a sub-block (e.g., set of NAND strings). FIG. 4 depicts an example having one IR region and thereby two sub-blocks. However, there may be more than one IR region and thereby more than two sub-blocks. Optionally, the IR region can extend down through all of the alternating dielectric layers and conductive layers.

Figure 4A:
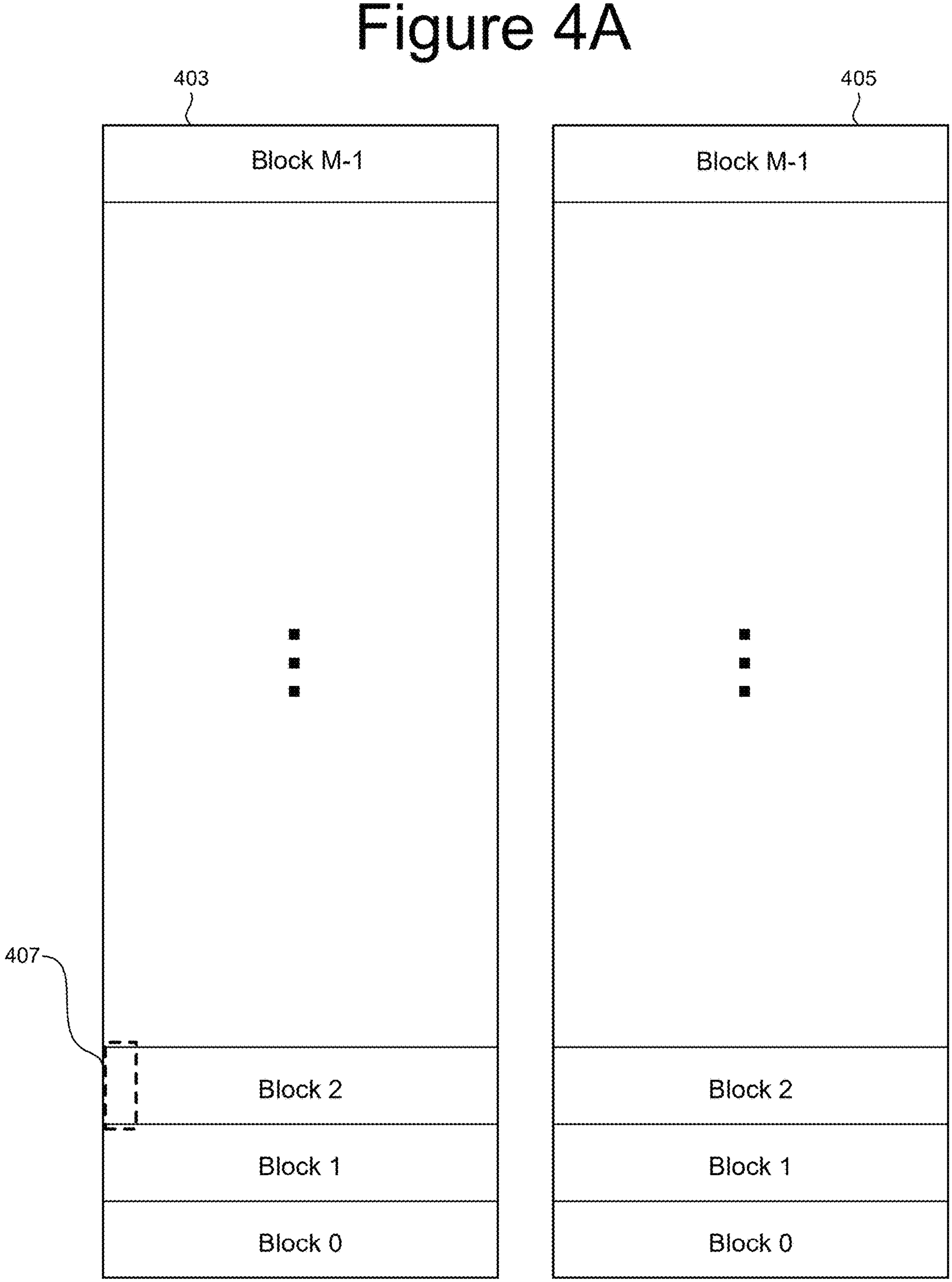
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks (or more briefly "blocks"). However, different numbers of blocks and planes can also be used. In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
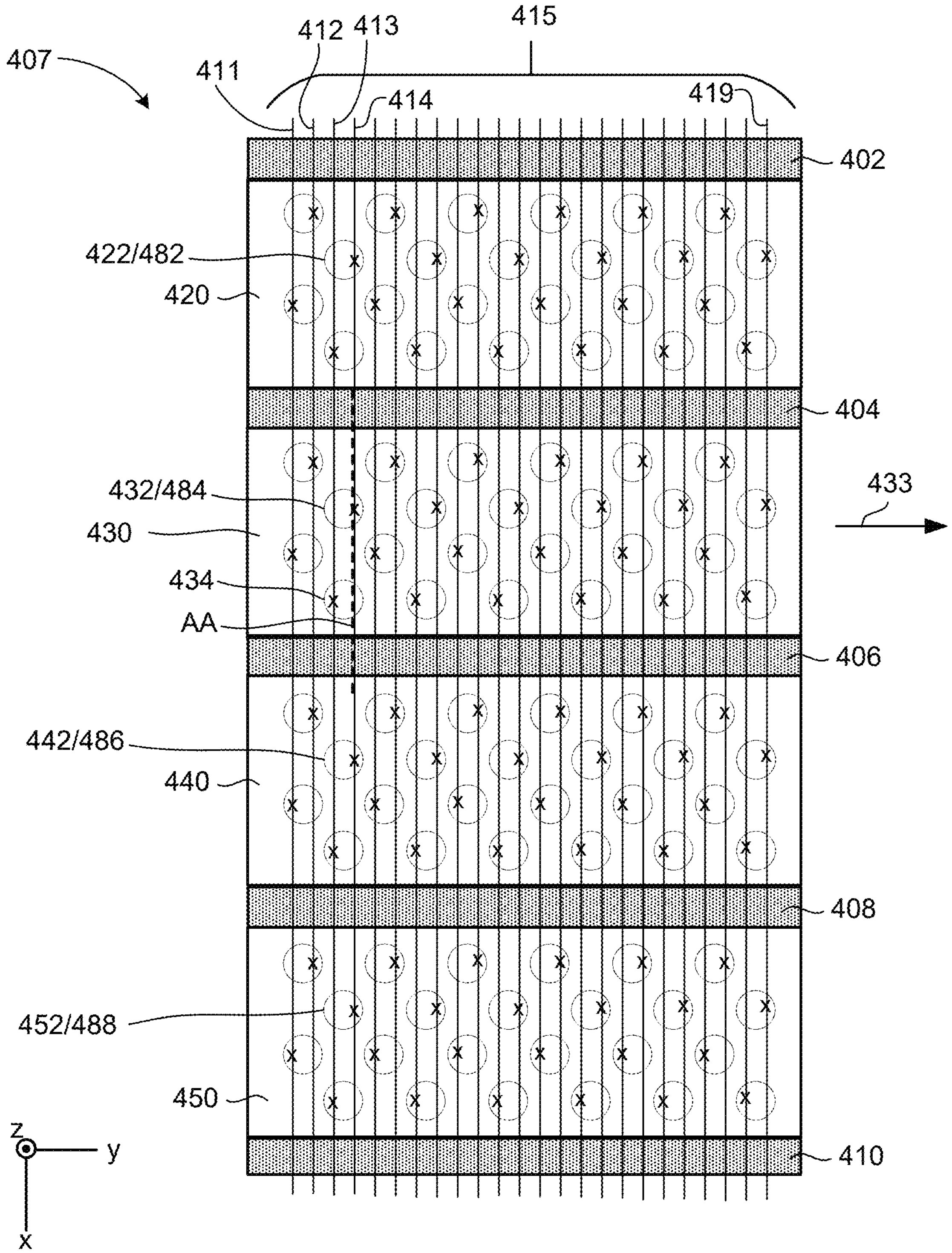
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of $SiO_2$; however, other dielectric materials can also be used. Isolation regions 402, 404, 406, 408, and 410 serve to divide the top layers of the physical block into four regions; for example, the top layer depicted in FIG. 4B is divided into regions 420, 430, 440, and 450, which are referred to herein as "sub-blocks. Each sub-block contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different strings can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
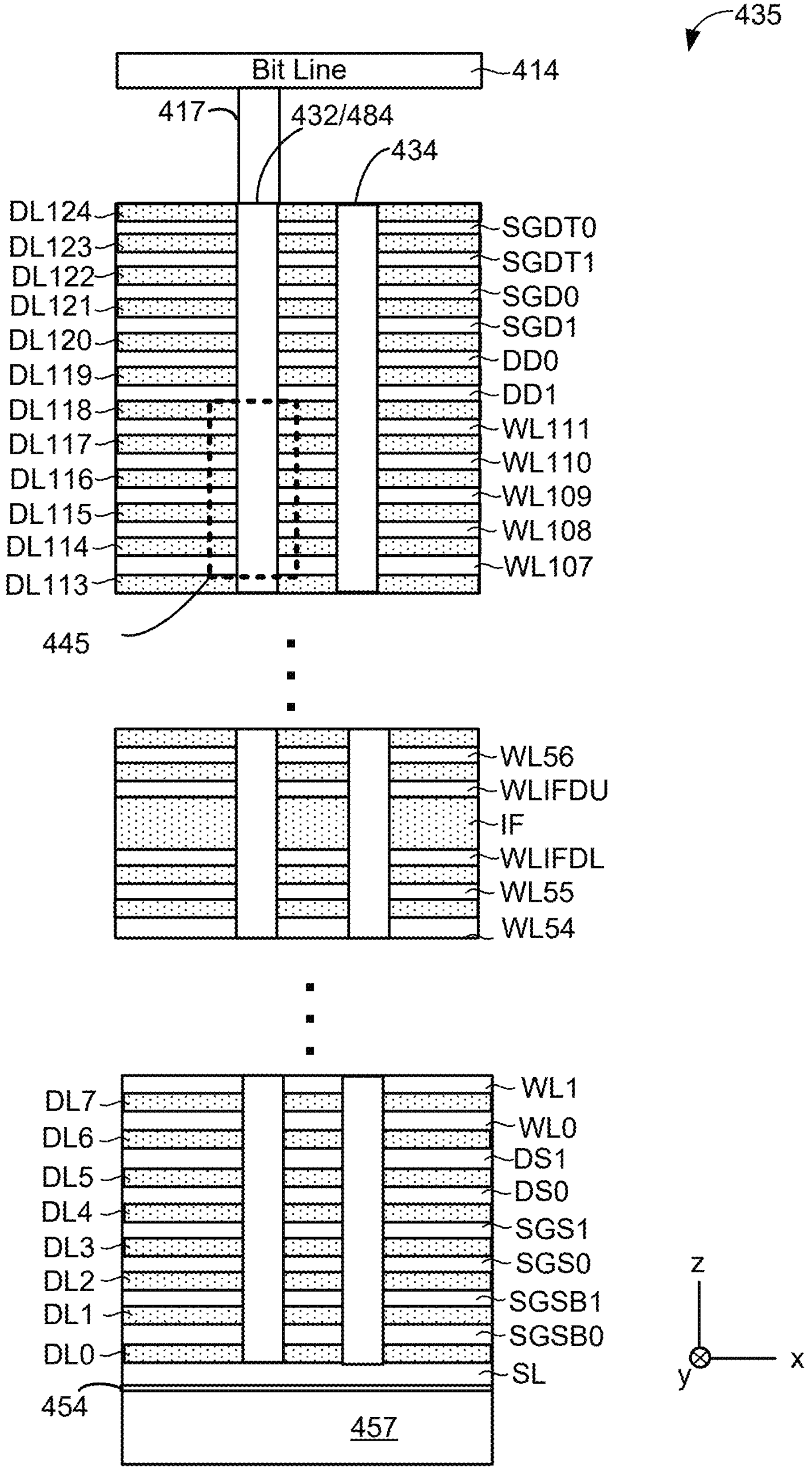
FIG. 4C depicts an embodiment of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIFDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two sub-blocks (SB). The two SB stack comprises SB0 and SB1. A two SB or other multi-SB stack can be used to form a relatively tall stack while maintaining a relatively narrow memory hole width (or diameter). After the layers of the lower SB are formed, memory hole portions are formed in the lower SB. Subsequently, after the layers of the upper SB are formed, memory hole portions are formed in the upper SB, aligned with the memory hole portions in the lower SB to form continuous memory holes from the bottom to the top of the stack. The resulting memory hole is narrower than would be the case if the hole were etched from the top to the bottom of the stack rather than in each SB individually. An interface (IF) region is created where the two SBs are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU).

Figure 4D:
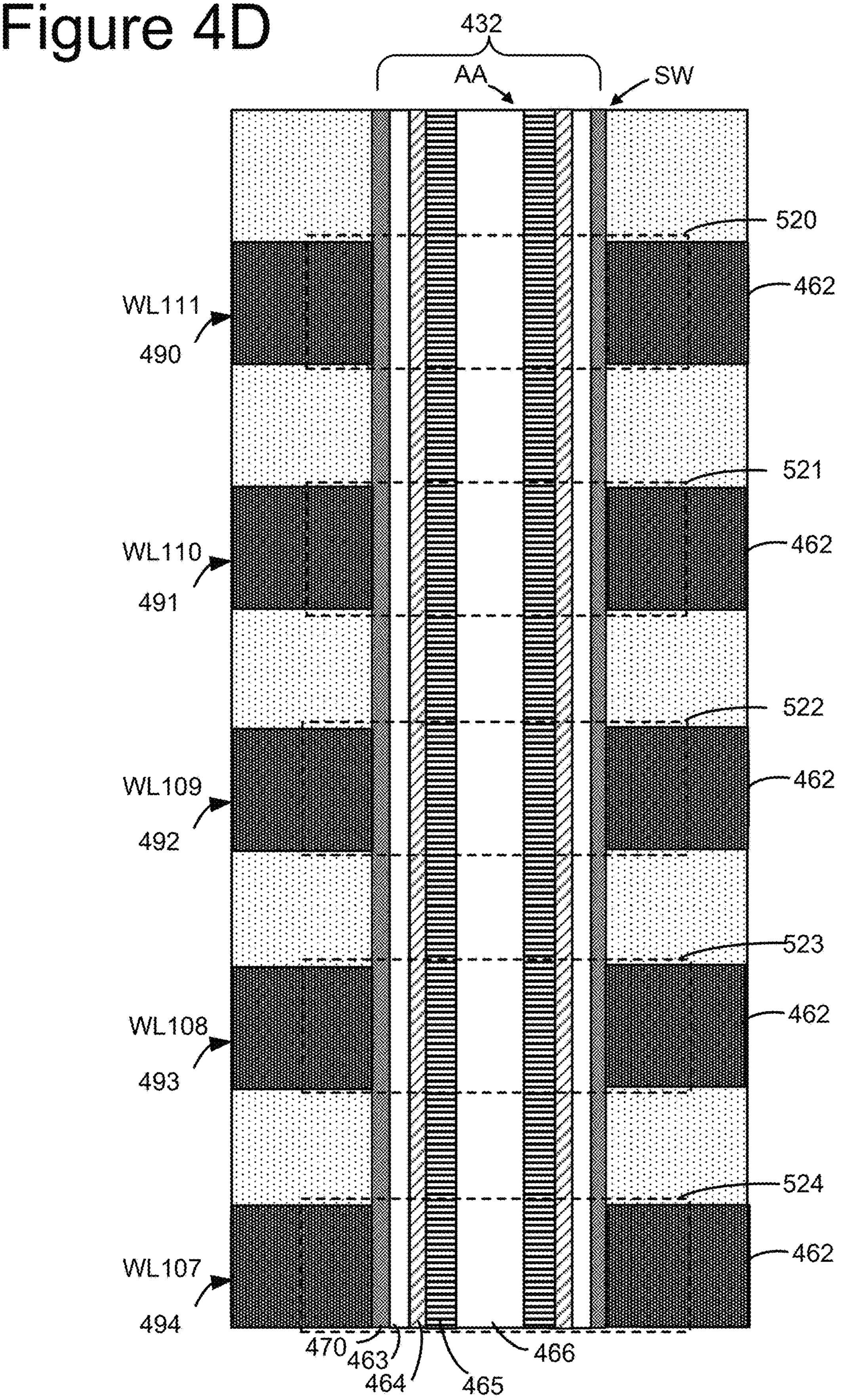
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
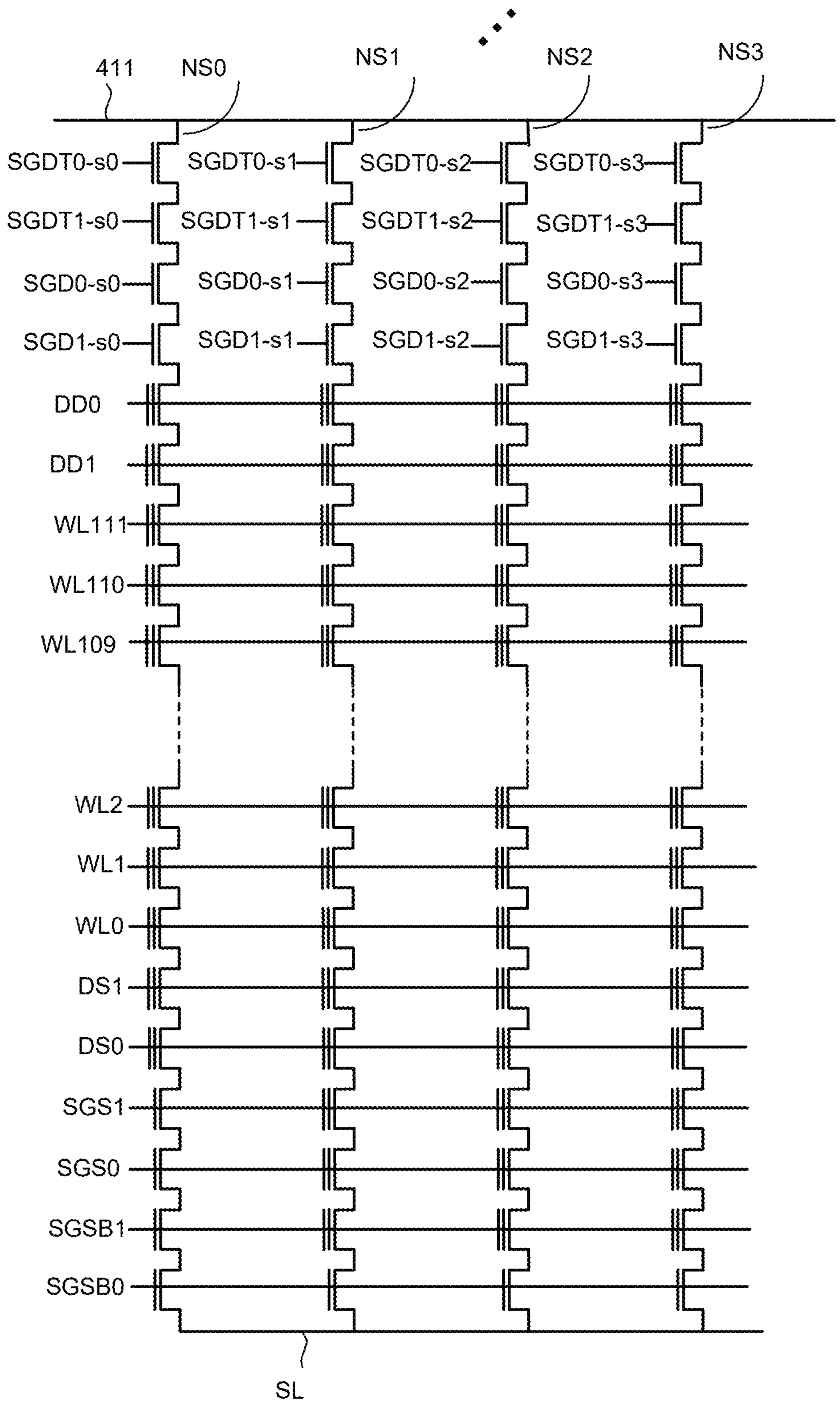
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND string NS3.

In one embodiment, there are four sets of drain side select lines in the physical block. For example, the set of drain side select lines connected to NS0 include SGDT0-*s*0, SGDT1-*s*0, SGD0-*s*0, and SGD1-*s*0. The set of drain side select lines connected to NS1 include SGDT0-*s*1, SGDT1-*s*1, SGD0-*s*1, and SGD1-*s*1. The set of drain side select lines connected to NS2 include SGDT0-*s*2, SGDT1-*s*2, SGD0-*s*2, and SGD1-*s*2. The set of drain side select lines connected to NS3 include SGDT0-*s*3, SGDT1-*s*3, SGD0-*s*3, and SGD1-*s*3. Herein the term "SGD" may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four "sub-blocks." A first sub-block corresponds to those vertical NAND strings controlled by SGDT0-*s*0, SGDT1-*s*0, SGD0-*s*0, and SGD1-*s*0. A second sub-block corresponds to those vertical NAND strings controlled by SGDT0-*s*1, SGDT1-*s*1, SGD0-*s*1, and SGD1-*s*1. A third sub-block corresponds to those vertical NAND strings controlled by SGDT0-*s*2, SGDT1-*s*2, SGD0-*s*2, and SGD1-*s*2. A fourth sub-block corresponds to those vertical NAND strings controlled by SGDT0-*s*3, SGDT1-*s*3, SGD0-*s*3, and SGD1-*s*3. As noted, FIG. 4E only shows the NAND strings connected to bit line 411. However, a full schematic of the block would show every bit line and four vertical NAND strings connected to each bit line.

In one embodiment, all of the memory cells on the NAND strings in a physical block are erased as a unit. However, in some embodiments, a physical block is operated as multiple tiers, with each tier containing a contiguous set of word lines. For example, memory cells connected to WL0-WL55 may be in one tier and memory cells connected to WL56-WL111 may be in another tier. A physical block could be operated in more than two tiers. Erase units can be formed based on other divisions of physical blocks.

FIG. 4F1, 4F2, and 4F3 depict several examples of how word lines in a block may be driven by word line drivers. For simplicity, a single word line of the block is depicted for each example. In an embodiment, the memory controller 120 will factor in the technique used to drive the word lines when performing defect detection following a successful read retry. Note that other techniques could be used to drive the word lines. Hence, embodiments of performing defect detection following a successful read retry are not limited to the examples in FIG. 4F1, 4F2, and 4F3.

In the example in FIG. 4F1, the word line (WLn) is driven from one end by a single word line driver (WLn driver). The number of memory cells connected to the word line is referred to herein as a "page" of memory cells. As one example, the page is 16 KB. The other word lines in the block are also driven by a single WLn driver. One option is to drive odd word lines from one end of the word line and to drive even word line from the other end of the word line.

In the example in FIG. 4F2, the word line (WLn) is driven from both ends. One end is driven by WLn driver1 and the end is driven by WLn driver2. Other word lines in the block may be also driven at both ends. Consistent with the example in FIG. 4F1, a "page" of 16 KB memory cells may be connected to the word line.

In the example in FIG. 4F3, the word line is divided into two segments (WLnA, WLnB). Each WL segment may be ½ of a page. For example, 8 KB of memory cells may be connected to WL segment WLnA and 8 KB of memory cells may be connected to WL segment WLnB. Each WL segment is driven by its own driver. WLn driverA drives WL segment WLnA and WLn driverB drives WL segment WLnB. Note that the locations of the WL drivers are not required to be at the ends of the segments shown in FIG. 4F3, as either WL driver could be at the other end of its segment.

Although the example memories of FIGS. 4-4F3 are three dimensional memory structure that includes vertical NAND strings with charge-trapping material, other 3D memory structures can also be used with the technology described herein.

Figure 5A:
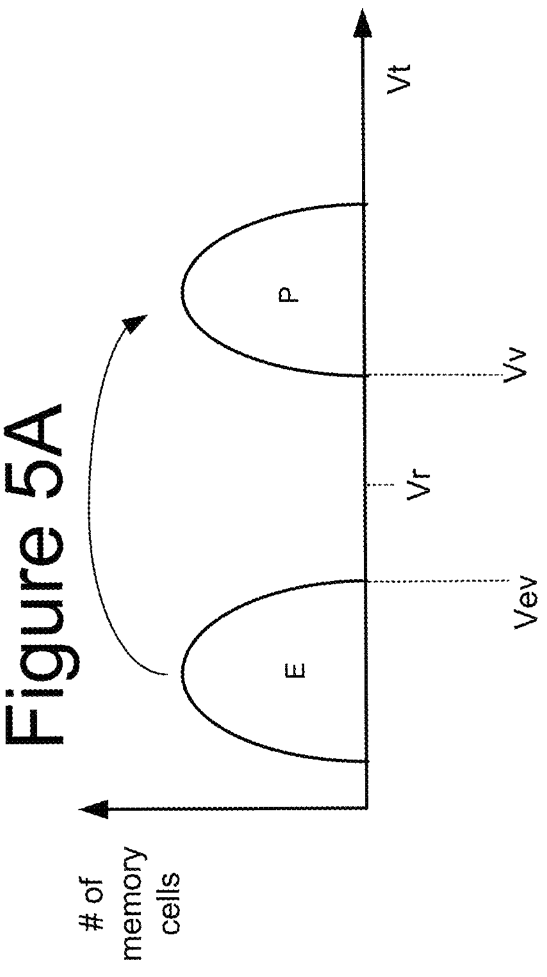
FIGS. 5A and 5B depicts threshold voltage distributions.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine whether a memory cells is erased (state E) or programmed (state P). FIG. 5A also depicts program verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
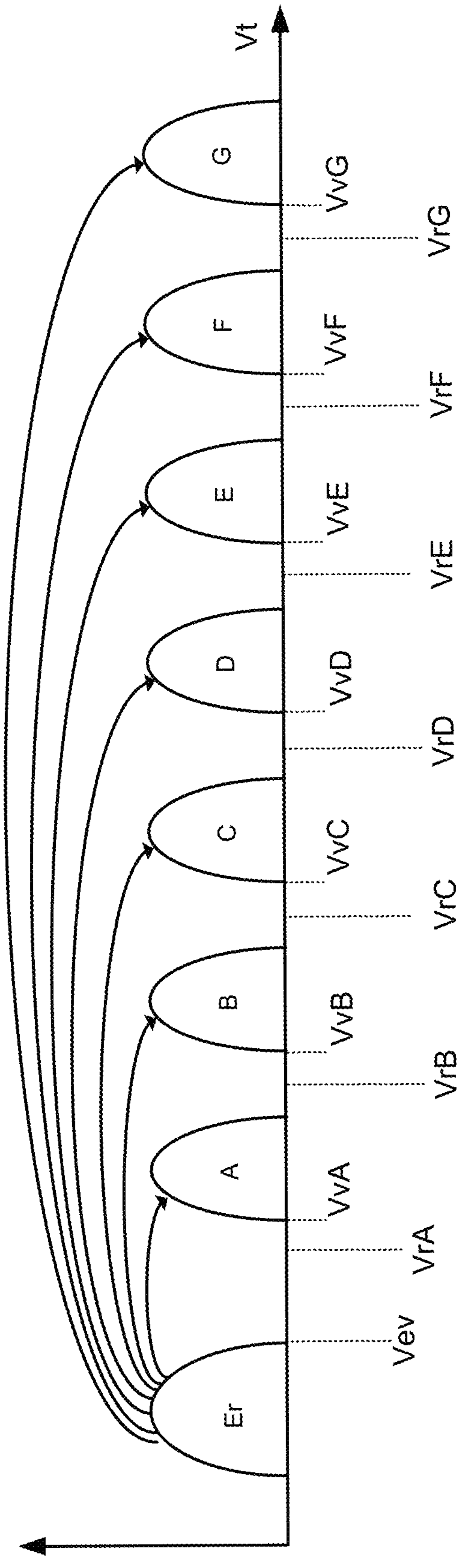

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 5C:
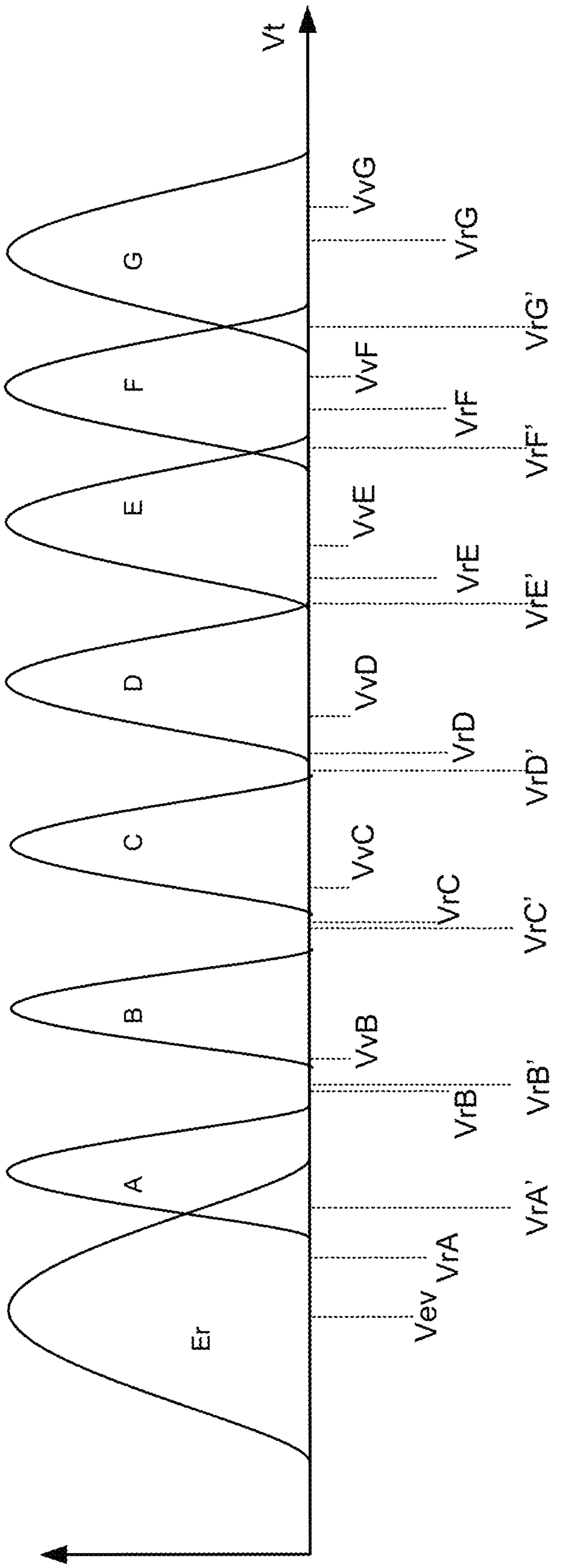
FIG. 5C depicts Vt distributions similar to those in FIG. 5B, but with some shifting in the Vt distributions.

Using the default read reference voltages may, in some cases, result in a read failure due to the inability of the ECC engine 158 to decode the data. FIG. 5C depicts Vt distributions similar to those in FIG. 5B, but with the Vt distributions in non-ideal locations. The lower tails of the upper states (e.g., E-, F-, G-state) are significantly lower than ideal, as evidenced by the lower tail locations relative to both the verify voltages (e.g., VvE, VvF, VvG) and default read voltages (e.g., VrE, VrF, VrG). Other Vt distributions may also see their lower tail at a lower than ideal location. Some Vt distributions could have the upper tail above an ideal location. For example, the Er-state upper tail is above the erase verify Vev and even above the default A-read level VrA. It is possible that other Vt distributions could also have an upshift in the upper tail.

The Vt distributions could be in the non-ideal locations due to inherent reliability issues such as read disturb or data retention. However, the Vt distributions could also be in non-ideal locations due to a physical defect such as a word line to memory hole short. As one example, a word line to memory hole short may result in word line leakage during program verify, which may reduce the magnitude of the verify voltage on the word line. The lowering of the magnitude of the verify voltage results in a lowering of the Vt of most states (with higher states being impacted to a greater extent). However, the erase state can be disturbed upwards due to the program operation needing more program loops to complete.

Attempting to read using the default read voltages may result in a very high bit error rate (BER), and may even result in a read failure (i.e., inability of the ECC engine 158 to decode the ECC codewords). Therefore, the memory system 100 may change the read reference voltages and then retry the read. A number of different techniques may be used to change the read reference voltages. One technique, referred to as a dynamic read table (DRT) read is to access a table of pre-defined shifted read voltage. A DRT read involves accessing a table that contains a number of sets of pre-determined read reference voltages. The memory system will select one of the sets of pre-determined read reference voltages and retry the read of the group of memory cells. Other techniques may be used to re-calibrate the read reference voltages based on an information collected from reading the memory cells. One technique to re-calibrate the read reference voltages is a "Valley Search Scan." A Valley Search Scan will read the memory cells to look for a valley between two adjacent Vt distributions. The valley point may be used as the new read reference level. Further details of using a Valley Search Scan to determine a target read level are described in U.S. Pat. No. 11,482,296, "ECC in Integrated Memory Assembly," which is hereby incorporated by reference. Another technique to re-calibrate the read reference voltages is referred to as a Bit Error Estimation (BES) read." A BES read may include sensing memory cells using different sets of read levels and then determining an error that is proportional to the BER, such as syndrome weight (SW), for each set of read reference voltages. Then, the read reference voltage providing the lowest metric (e.g., lowest SW) may be selected as the optimal read reference voltage which is expected to minimize the BER. Further details of using a BES to determine a target read level are described in U.S. Pat. No. 10,991,444, "Tiered Read Reference Calibration," which is hereby incorporated by reference. Another read technique for which read reference voltages may be re-calibrated is referred to as a "Time Tag Read." Groups of blocks or WLs that were programmed roughly at the same time and temperature may be associated with a certain time & temperature tag (TT) for which an appropriate set of read reference voltages may be maintained. The read reference voltages of the group associated with a given time & temperature tag may be adjusted from time to time by running a calibration algorithm, such as a valley scan or BES, on representative page(s) from the group.

An example set of new read reference voltages are depicted (VrA', VrB', VrC', VrD', VrE', VrF', VrG'). In some cases using the new read reference voltages will still result in a read failure. However, the memory system may use a number of different techniques to derive new read reference voltages and continue to perform retries until the read is successful. In an embodiment, the memory system will perform physical defect detection following a successful read retry to determine whether there is a physical defect in the block that contains the memory cells or whether the read failure was instead due to inherent cell reliability issues (e.g., data retention, read disturb). If the memory system determines that there is a physical defect in the block, then the block may be retired. In the event that new read reference voltages cannot be found to successfully read the memory cells, a technique such as an XOR recovery may be used to recover the data that was programmed into the memory cells. However, note that by pro-actively retiring blocks that are found to have a physical defect, the memory system greatly reduces the chance of needing to resort to XOR recovery or the like. Moreover, pro-actively retiring blocks that are found to have a physical defect alleviates the need for time consuming read retries within the block having the physical defect.

Figure 6:
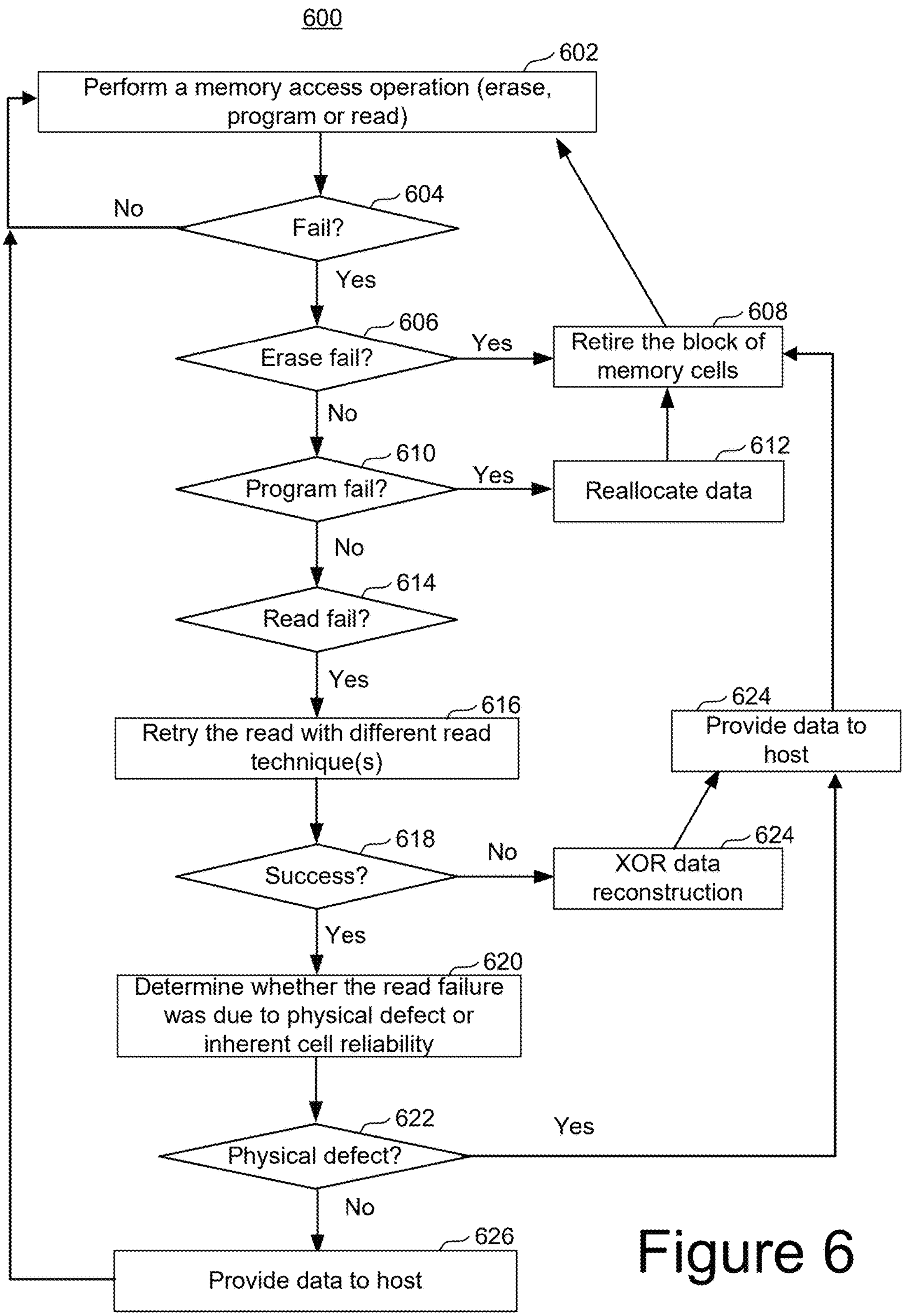
FIG. 6 is a flowchart of one embodiment of a process of operating non-volatile memory.

FIG. 6 is a flowchart of one embodiment of a process 600 of operating non-volatile memory, with an emphasis on handing errors. The process 600 may be performed by one or more control circuits (e.g., one or more of memory controller 120, system control logic 260, row control circuitry 220, and/or column control circuitry 210. Process 600 may be used to operate NAND memory cells in a NAND memory architecture such as, but not limited to, those depicted in FIGS. 4-4F3.

Step 602 is performance of a memory access operation. The memory access operation could be an erase, program, or read. Each of these operations could succeed or fail. Step 604 is a determination of whether the memory operation failed. If the memory operation did not fail then another memory operation may be performed in step 602. If the memory operation failed then the memory system handles the failure based on the type of memory operation. If the failed memory operation is an erase operation (step 606 is yes), then the memory system retires the block in step 608. If the failed memory operation is a program operation (step 610 is yes), then the memory system reallocates the data to another block in step 612. The memory system then retires the block in step 608. Note that in the erase and program fails the block is retired such that no further issues occur with the block.

Otherwise, the failed memory operation is a read operation (step 614 is yes). In an embodiment, the read is default read using the presently established read reference levels. These may be the "default" read levels but are not required to be the "default" read levels. In an embodiment, the memory system is able to use different timing parameters during read. In an embodiment, the memory system has a "fast read" that is used for read in step 602. If the fast read fails, then the memory system may use a read with longer timing parameters during read retry. Thus, the read in step 602 may be a fast read. In an embodiment, the read failure occurs due to a failure of the ECC engine 158 to decode the ECC codeword(s) read from the memory cells.

Therefore, the process continues on to step 616. Step 616 includes retrying the read operation one or more times with one or more different read techniques. These different read techniques could include using different read reference voltages. Step 616 may include using techniques that are progressively more time consuming (see, for example, process 800 in FIG. 8). Step 618 is a decision box that branches based on whether the read retry was successful. Step 620 is performed if any of the read retries were successful. Step 620 includes determining whether the original read failure was due to an inherent reliability issue or due to a physical defect. In an embodiment, the memory system determines whether errors in the original read are physically clustered. A physical clustering of errors may be due to a physical defect as opposed to inherent reliability issues. A physical clustering of errors means that the error rate is significantly higher in a physically contiguous subgroup of the memory cells than other subgroups. If the original read failure was due to a physical defect (step 622 is yes) then in step 624 the data that was successfully read in the read retry is provided to the host 102. Then, the memory system retires the block in step 608. On the other hand, if the original read failure was due to an inherent reliability issue (step 622 is no) then in step 626 the data that was successfully read in the read retry is provided to the host 102. The process then returns to step 602 to perform another memory operation. Thus, if the original read failure was due to an inherent reliability issue then the block may continue to be used.

Returning again to the discussion of step 618, if the read retry step was not successful, then in step 624 an XOR process may be used to recover the data. In addition to storing the ECC codewords in the non-volatile storage system, the memory system 100 may compute and store XOR data. One technique is to accumulate XOR data based on successive bitwise exclusive OR (XOR) operations of the data that is programmed into the memory cells of a block. For example, initially a bitwise XOR is performed between the first two units of data that are programmed into the memory cells to form the initial XOR accumulation. Then, as each additional unit of data is programmed in the block, a bitwise XOR is performed between the current XOR accumulation and the new unit of data being programmed. The XOR data may be used to recover the user data in the event that the ECC engine 158 fails to decode one or more ECC codewords in the block, which is referred to herein as an unrecoverable by ECC decoder error (UECC). Then, in step 606 the memory system retires the block.

Figure 7:
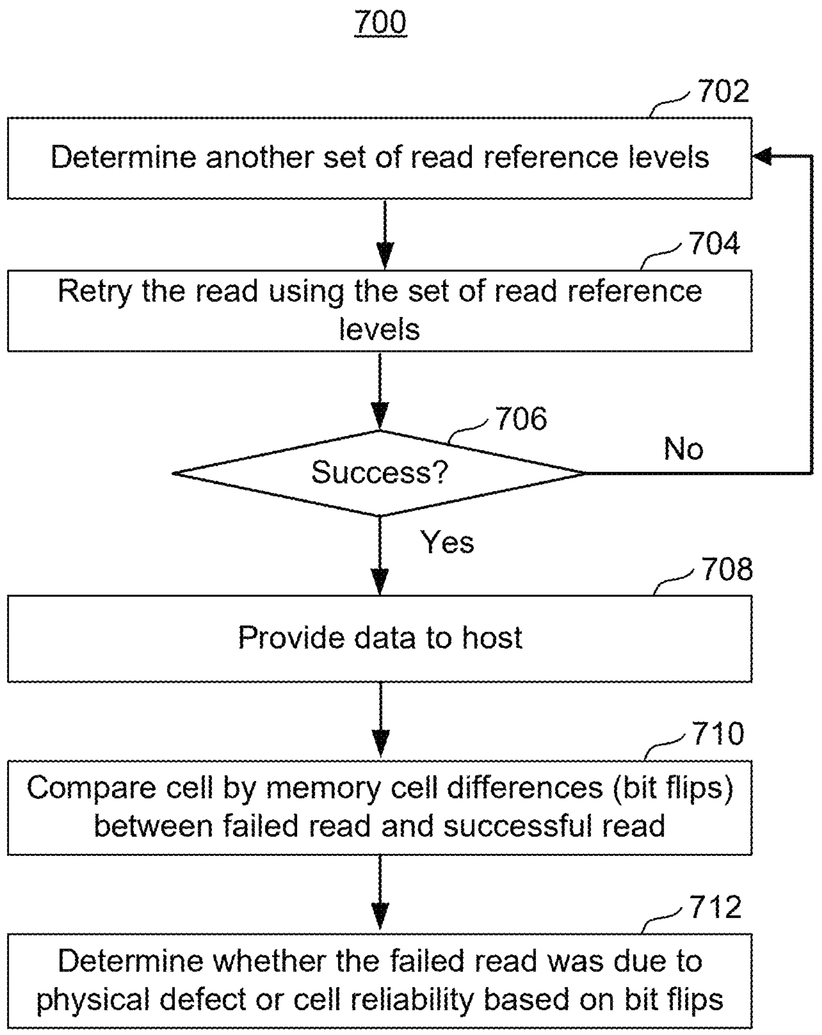
FIG. 7 is a flowchart of one embodiment of a process of performing read retries in response to a read failure.

FIG. 7 is a flowchart of one embodiment of a process 700 of performing read retries in response to a read failure. Process 700 may be performed in response to a read failing as determined by, for example, step 614 of process 600. In an embodiment, the read failure occurs due to a failure of the ECC engine 158 to decode the ECC codewords read from the memory cells. The process 700 may be performed by one or more control circuits (e.g., one or more of memory controller 120, system control logic 260, row control circuitry 220, and/or column control circuitry 210. Process 700 may be used to operate NAND memory cells in a NAND memory architecture such as, but not limited to, those depicted in FIGS. 4-4E.

Step 702 includes the memory system determining another set of read reference levels that have not previously been used in the original read that failed or in any of the read retries. There are a number of techniques for determining read reference levels including, but not limited to, DRT, Valley Search Scan, BES.

Step 704 includes reading the memory cells using the set of read reference levels determined in step 702. Step 704 includes the ECC engine attempting to decode one or more ECC codewords read from the memory cells. Step 706 is a decision based on whether the read was successful. If the read was not successful then the process returns to step 702 to determine another set of read reference levels. The process 700 continues with new sets of read reference levels until the memory cells are successfully read. After the memory cells are successfully read the decoded data is provided to the host 102 in step 708.

Step 710 includes comparing memory cell differences between the failed read and the successful read. The memory cell differences are referred to herein as "bit flips." A bit flip refers to a memory cell having a different bit value for the successful read than for the failed read. Step 710 may include reading the memory cells using the read reference levels used in the failed read and again reading the memory cells using the read reference levels used in the successful read. The cell-by-cell differences between these two reads may be used as the bit flips.

Step 712 includes determining whether the failed read was due to a physical defect or inherent cell reliability based on the bit flips. Step 712 may include analyzing the physical locations of the memory cells having a bit flip. If there is a physical defect, then this may result in some memory cells that were read being more impacted by the physical defect than others. For example, memory cell near the physical defect may be more impacted by the physical defect than those further from the physical defect. As a particular example, a short may pull down a voltage on region of a word line near the short, thereby impacting memory cells near the short. Thus, if a significant number of memory cells in a particular physical region have bit flips this may indicate a physical defect is likely in that physical region. Therefore, the memory system may determine whether there is a physical clustering of errors in the original failed read, which may indicate a physical defect is likely. On the other hand, if the bit flips are randomly distributed this may indicate that the read failure was likely due to inherent reliability issues.

Figure 8:
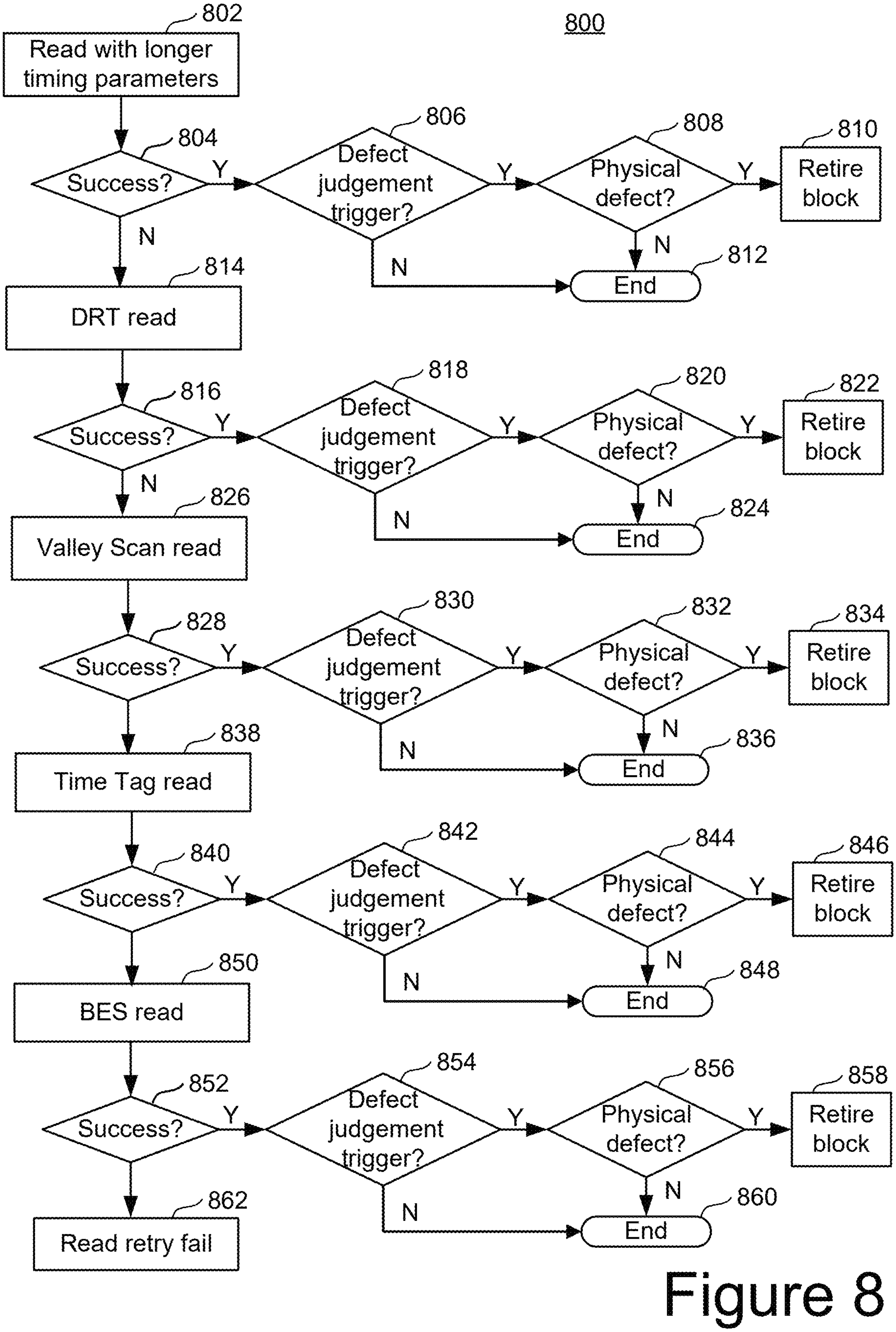
FIG. 8 is a flowchart of an embodiment of a process of read retry with defect judgement.

FIG. 8 is a flowchart of an embodiment of a process 800 of read retry with defect judgement. Process 800 may be performed in response to a read in step 602 of process 600 failing (as determined in step 614). In an embodiment, the read failure occurs due to a failure of the ECC engine 158 to decode the ECC codewords read from the memory cells. The process 800 may be performed by one or more control circuits (e.g., one or more of memory controller 120, system control logic 260, row control circuitry 220, and/or column control circuitry 210. Process 800 may be used to operate NAND memory cells in a NAND memory architecture such as, but not limited to, those depicted in FIGS. 4-4E.

Briefly, process 800 contains a number of possible read retry techniques (read with longer timing parameters (step 802), DRT read (step 814), valley scan read (step 826), Time Tag read (step 838), BES read (step 850). For each of these read retry techniques the memory system will determine whether or not to perform defect judgement (e.g., determine whether there is a physical defect in the block). The read retry techniques are ordered such that the more time consuming techniques are performed later, but are better at handling more severe distortion in the Vt distributions. A more severe distortion in the Vt distributions may indicate that a physical defect is more likely. Therefore, in some embodiment, the memory system reserves performing defect judgement for the techniques that are better at handling more severe distortion in the Vt distributions (e.g., BES).

Step 802 includes the reading the group of memory cells having the failed read with a read with longer timing parameters than were used in the failed read. Reading with longer timing parameters can sometimes be successful even if the same read reference levels that were used in the original failed read are again used. Moreover, the read with longer timing parameters is still a relatively fast read operation. Step 804 is a determination of whether the read with longer timing parameters was successful. If it was successful then step 806 includes a determination of whether this successful read should trigger defect judgement. If defect judgement is triggered, then in step 808 the memory system determine whether the read failure was due to a physical defect in the block having the group of memory cells or whether the read failure was due to inherent cell reliability. If the memory system determines that there is a physical defect in the block, then in step 810 the block is retired. Otherwise, this branch of the process ends at step 812. Returning to the discussion of step 806, if this successful read with longer timing parameters does not trigger defect judgement then this branch of the process also ends at step 812.

Returning again to the discussion of step 804, if the read with longer timing parameters was not successful then another read retry technique is used in step 814. Step 814 includes a dynamic read table (DRT) read. A DRT read involves accessing a table that contains a number of sets of pre-determined read reference voltages. The memory system will select one of the sets of pre-determined read reference voltages and retry the read of the group of memory cells. Step 816 is a determination of whether the DRT was successful. If it was successful then step 818 includes a determination of whether the successful DRT read should trigger defect judgement. If defect judgement is triggered, then in step 820 the memory system determines whether the read failure was due to a physical defect in the block having the group of memory cells or whether the read failure was due to inherent cell reliability. If the memory system determines that there is a physical defect in the block, then in step 822 the block is retired. Otherwise, this branch of the process ends at step 824. Returning to the discussion of step 816, if the successful DRT read does not trigger defect judgement then this branch of the process also ends at step 824.

Returning again to the discussion of step 816, if the DRT read was not successful then another read retry technique is used in step 826. Step 826 includes a "valley scan read". A valley scan reading the memory cells to look for a valley adjacent Vt distribution and then setting the new read level at the valley. Step 828 is a determination of whether the valley scan read was successful. If the valley scan read was successful, then step 830 includes a determination of whether the successful valley scan read should trigger defect judgement. If defect judgement is triggered, then in step 832 the memory system determine whether the read failure was due to a physical defect in the block having the group of memory cells or whether the read failure was due to inherent cell reliability. If the memory system determines that there is a physical defect in the block, then in step 834 the block is retired. Otherwise, this branch of the process ends at step 836. Returning to the discussion of step 828, if the successful valley scan read does not trigger defect judgement then this branch of the process also ends at step 836.

Returning again to the discussion of step 828, if the valley scan read was not successful then another read retry technique is used in step 838. Step 838 includes a "Time Tag read". A Time Tag read involves associating groups of blocks or WLs that were programmed roughly at the same time and temperature with a certain time & temperature tag (TT) for which an appropriate set of read reference voltages may be maintained. The set of read reference voltages may be re-calibrated if desired using a technique such as a Valley Scan or BES. Step 840 is a determination of whether the Time Tag read was successful. If the Time Tag read was successful then step 842 includes a determination of whether the successful Time Tag read retry should trigger defect judgement. If defect judgement is triggered, then in step 844 the memory system determine whether the read failure was due to a physical defect in the block having the group of memory cells or whether the read failure was due to inherent cell reliability. If the memory system determines that there is a physical defect in the block, then in step 846 the block is retired. Otherwise, this branch of the process ends at step 848. Returning to the discussion of step 842, if the successful Time Tag read does not trigger defect judgement then this branch of the process also ends at step 848.

Returning again to the discussion of step 840, if the Time Tag read was not successful then another read retry technique is used in step 850. Step 850 includes a "Bit Error Estimation (BES) read". A BES read may include sensing memory cells using different sets of read levels and then determining an error that is proportional to the BER, such as syndrome weight (SW), for each set of read reference voltages. Then, the read reference voltage providing the lowest metric (e.g., lowest SW) may be selected as the optimal read reference voltage which is expected to minimize the BER. Step 852 is a determination of whether the BES read was successful. If the BES read was successful then step 854 includes a determination of whether the successful BES read retry should trigger defect judgement. If defect judgement is triggered, then in step 856 the memory system determine whether the read failure was due to a physical defect in the block having the group of memory cells or whether the read failure was due to inherent cell reliability. If the memory system determines that there is a physical defect in the block, then in step 858 the block is retired. Otherwise, this branch of the process ends at step 860. Returning to the discussion of step 854, if the successful BES read does not trigger defect judgement then this branch of the process also ends at step 860.

Returning again to the discussion of step 852, if the BES read was not successful then the process 800 may conclude in step 862 with a status of read retry fail. Optionally, additional read retry techniques may be performed prior to concluding with a status of read retry fail. In an embodiment, if the process 800 concludes in step 862 with a status of read retry fail then a technique such as XOR recovery may be used to recover the data (see XOR data reconstruction in step 624 of process 600).

Figure 9:
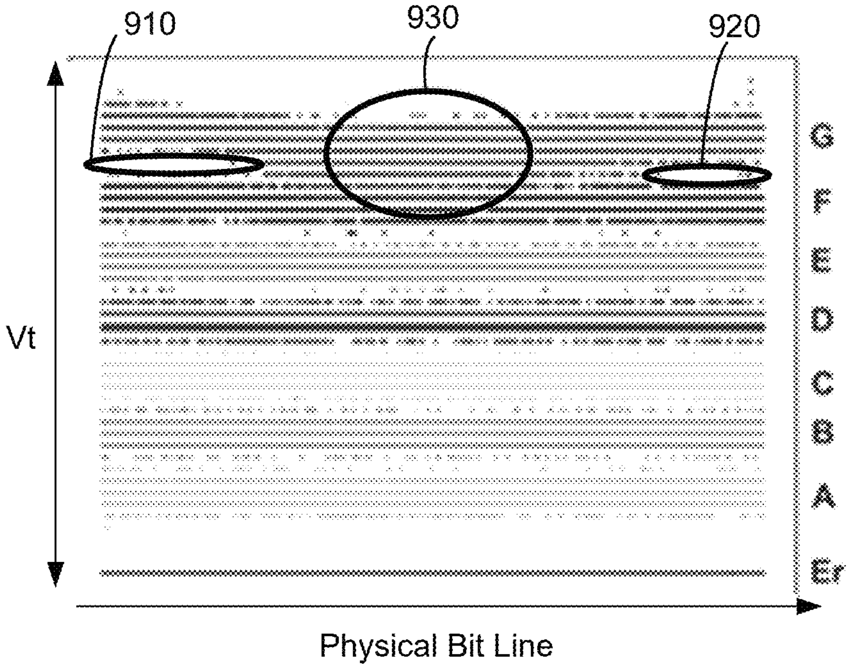
FIG. 9 shows memory cell Vt versus physical bit line for memory cells programmed to eight states as in FIG. 5B.

In some embodiments, the memory system analyzes data read from memory cells to determine whether the read error was due to a physical defect or an inherent reliability issue. Inherent reliability issues should result in the memory cell errors being randomly distributed. On the other hand a physical defect may result in memory cell errors being localized to certain cells based on the location of the physical defect. FIG. 9 shows memory cell Vt versus physical bit line for memory cells programmed to eight states as in FIG. 5B. The data states are labeled on the right side. Some of the memory cells may have negative Vts, such as the Er state and possible even the A-and B-states. In general, there should be a slight gap between the data states. Ellipses 910 and 920 points out physical bits lines for which there is a gap between the F-state and the G-state. Ellipse 930 points out physical bits lines for which there is not a gap between the F-state and the G-state. The lack of gap is due to some memory cells that should be in the G-state having too low of a Vt, therefore spreading into the F-state (referred to as a G to F failure). Significantly, there is a clustering of the memory cells with errors—in this example, the clustering being the middle physical bit lines.

Figure 10A:
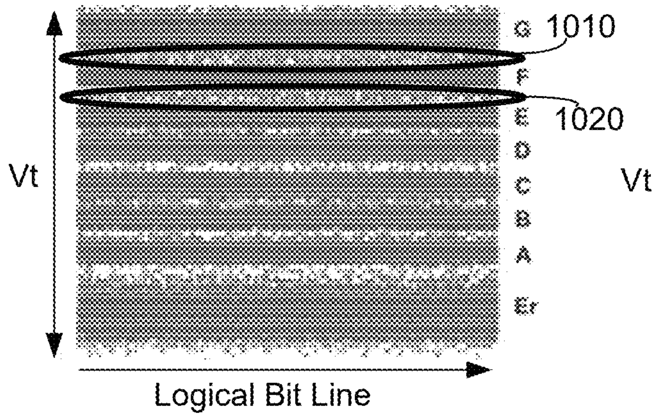
FIG. 10A shows memory cell Vt versus logical bit line for memory cells programmed to eight states as in FIG. 5B.

In some embodiments, the memory system programs the bit lines as logical bit lines where the numbers of the logical bit lines do not correspond to actual physical location. FIG. 10A shows memory cell Vt versus logical bit line for memory cells programmed to eight states as in FIG. 5B. In this example, there is a physical defect that manifests as a G to F error and also as an F to E error. The G to F error means that some G-state cells have too low of a Vt and thus there is a merging of the G and F states, as indicated by ellipse 1010. The F to E error means that some F-state cells have too low of a Vt and thus there is a merging of the F to E states, as indicated by ellipse 1020. However, because FIG. 10A is for the logical (not physical bit lines) the physical clustering is not evident.

Figure 10B:
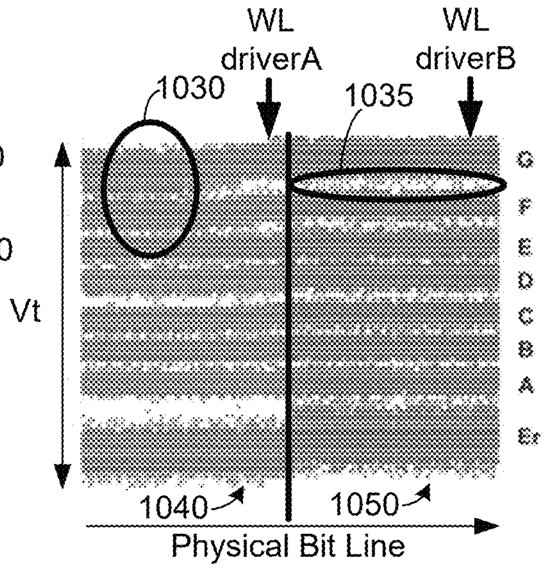
FIG. 10B shows memory cell Vt versus physical bit line for the same data as in FIG. 10A.

FIG. 10B shows memory cell Vt versus physical bit line for the same data as in FIG. 10A. The numbers of the physical bit lines correspond to actual physical location. In this example, there are two word line drivers for the word line, with each word line driver driving one segment of the word line. For example, WL driver A driver WL segment 1040 and WL driver B driver WL segment 1050. The memory cells are divided into cells connected to WL segment 1040 and cells connected to WL segment 1050 of the block. The memory cells connected to WL segment 1040 may be referred to being in the left half of the block and the memory cells connected to WL segment 1050 may be referred to being in the right half of the block. The ellipse 1030 shows the clustering of the errors due to the G to F error and the F to E error. The clustering of the errors indicates the presence of a physical defect near the cluster of cells having the errors. Specifically, the physical defect is in the left half of the block. The ellipse 1035 shows a gap in Vt between the F-state and G-state, which shows few errors for memory cells in the right half of the block. In an embodiment the memory system compares errors in the left half of the block with errors in the right half of the block to determine whether the block has a physical defect.

Returning again to the discussion of FIG. 10A, recall that the diagram is for cell Vt versus logical bit line. However, a similar pattern for cell Vt versus physical bit line may indicate that the read error was due to inherent cell reliability issues and not a physical defect. For example, if the random pattern of errors highlighted by ellipse 1010 and ellipse 1020 were to be present for cell Vt versus physical bit line, then this may indicate that the read error was due to inherent cell reliability issue and not a physical defect.

Figure 11:
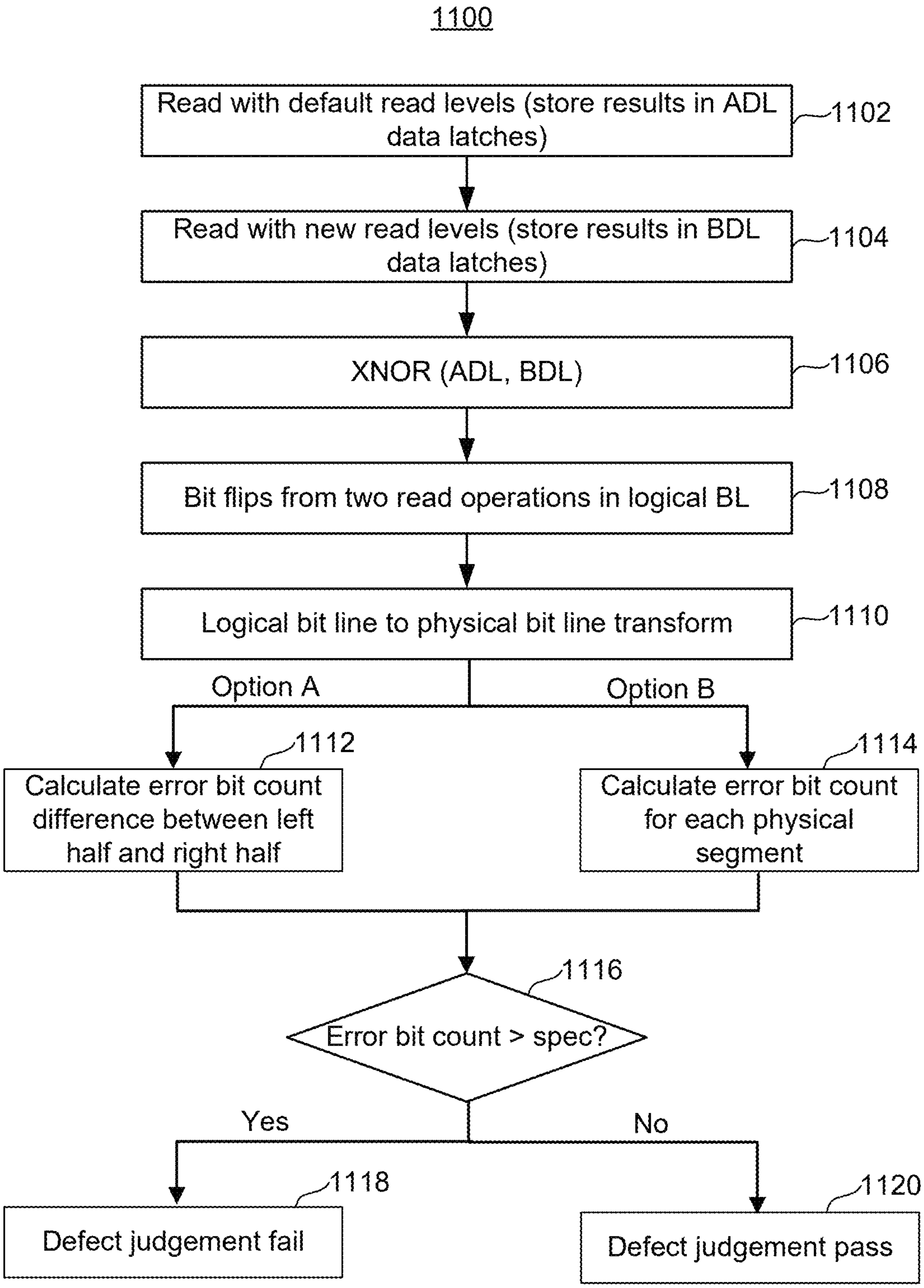
FIG. 11 is a flowchart of one embodiment of a process of defect judgement.

FIG. 11 is a flowchart of one embodiment of a process 1100 of defect judgement. The process 1100 may be performed following a successful read retry. The process 1100 could be performed for any read retry technique that uses a different set of read reference voltages than used in the failed read. The process 1100 may be performed by one or more control circuits (e.g., one or more of memory controller 120, system control logic 260, row control circuitry 220, and/or column control circuitry 210. Process 1100 may be used for NAND memory cells in a NAND memory architecture such as, but not limited to, those depicted in FIGS. 4-4E. Step 1102 includes reading the group of memory cells at default read levels (e.g., the read levels used in the failed read). The results from the first read may be stored in the ADL data latches as follows using an example of reading one page of the three pages stored in memory cells programmed to eight data states as in FIG. 5B. An example of reading at the VrE level and the VrA level will be used to discuss reading one of the pages. First the group of memory cells are sensed at the default VrE level with results being transferred from a sense node (SEN) in the comparison circuit 320 to, for example, the sense node latch 322 (see FIG. 3C). This may be expressed as: SEN→SDL. Then, the group of memory cells are sensed at the default VrA level with results initially being on the respective sense nodes (SEN). Then, the ADL latch for each cell is updated based on the contents of SEN and SDL as follows: ADL=~(~SEN & SDL). Therefore, each ADL latch stores one bit of the page as read with the default read levels.

Step 1104 includes reading the group of memory cells with new read levels that were determined in the successful read in the read retry. The example of reading at the VrE level and the VrA level will be continued. First the group of memory cells are sensed at the new VrE level with results being transferred from the sense node in the comparison circuit 320 to the sense node latch 322 (referred to as SDL). This may be expressed as: SEN→SDL. Then, the group of memory cells are sensed at the new VrA level with results initially being on the sense node (SEN). Then, the BDL latch for each cell is updated based on the contents of SEN and SDL as follows: BDL=~(~SEN & SDL). Therefore, each BDL latch stores one bit of the page as read with the new read levels.

Step 1106 includes an XNOR operation of the contents of the ADL latches and the BDL latches. The result may be stored in a third set of data latches (e.g., XDL) as follows: XDL=ADL⊙BDL.

Step 1108 is a determination of the bit flips between the two read operations in terms of logical bit lines. In an embodiment, the data from the XDL latches is transferred to the memory controller 120, which determines the bit flips in terms of logical bit lines based on the data in the order it is read from the XDL latches. In other words, in an embodiment, the contents of the XDL latches represents the logical bit lines (not the physical bit lines).

Step 1110 includes transforming the bit flips from logical bit lines to physical bit lines. The memory controller 120 may have a table, mapping, or the like to transform the logical bit lines to physical bit lines. Thus, after step 1110 the memory controller 120 knows the physical location of each memory cell that had a bit flip.

The next steps depend on whether Option A or Option B is to be performed. Option A corresponds to an architecture in which two word line drivers are used to drive the word line (see, for example, FIG. 10B). Step 1112 is performed for Option A. Step 1112 includes calculating an error bit count (or bit flips) difference between the left half of the block and the right half of the block. With reference to FIG. 10B, the memory controller 120 determines a first total for the bit flips for memory cells connected to the left segment 1040 of the word line and a second total for the bit flips for memory cells in the right segment 1050 of the word line. Then, the memory controller 120 determines the difference in bit flips between the two segments 1040, 1050, which is referred to as the "error bit count." Next, in step 1116, the memory controller 120 determines whether the error bit count is greater than a specification. The specification will factor in the technique used to determine the error bit count. As an example, specification could be whether the error bit count (e.g., difference between right and left sides of the block) is greater than 100. However, the specification could be higher or lower than 100. If the error bit count is greater than the specification then the result is "defect judgement fail" in step 1118, which indicates that there is a physical defect in the block. If the error bit count is not greater than the specification then the result is "defect judgement pass" in step 1120, which indicates that there is not a physical defect in the block. A defect judgement pass means that the original read failure likely occurred due to inherent cell reliability issues.

Returning again to the steps that follow step 1110, step 1114 is performed for Option B. Option B may correspond to an architecture with a single word line driver (see, for example, FIG. 9). Step 1114 includes calculating an error bit count (or bit flips) difference for each physical segment of the block. As an example, if there are 16 KB bit lines, then the block could be divided into 16 physical segments of 1 KB. The memory controller 120 determines a total number of bit flips for memory cells in each physical segment. In an embodiment, the memory controller 120 is looking for any physical segment having an unusually high number of bit flips. Therefore, the physical segment with the highest number of bit flips is used for the "error bit count" for Option B. Next, in step 1116, the memory controller 120 determines whether the error bit count is greater than a specification. The specification will factor in the technique used to determine the error bit count. As an example, specification could be whether the error bit count for any physical segment is greater than 50. However, the specification could be higher or lower than 50 for a physical segment. If the error bit count is greater than the specification then the result is "defect judgement fail" in step 1118, which indicates that there is a physical defect in the block. If the error bit count is not greater than the specification then the result is "defect judgement pass" in step 1120, which indicates that there is not a physical defect in the block. A defect judgement pass means that the original read failure likely occurred due to inherent cell reliability issues.

Figure 12A:
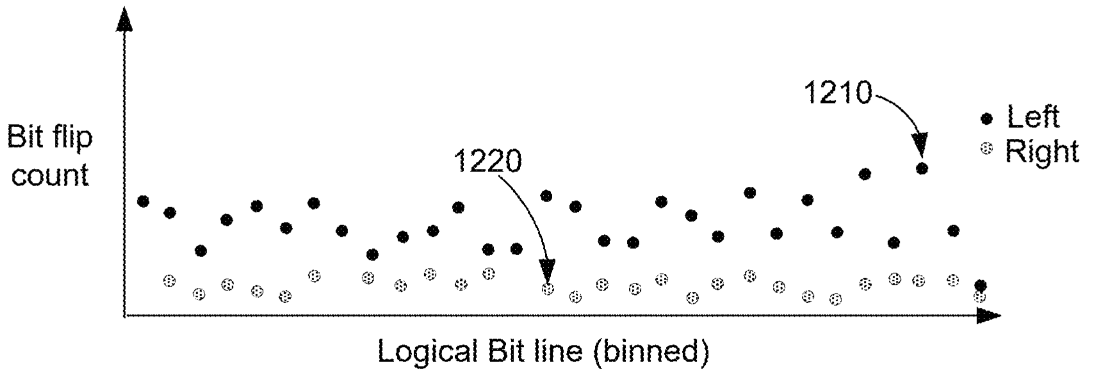
FIG. 12A shows counts of bit flips versus logical bit lines.
Figure 12B:
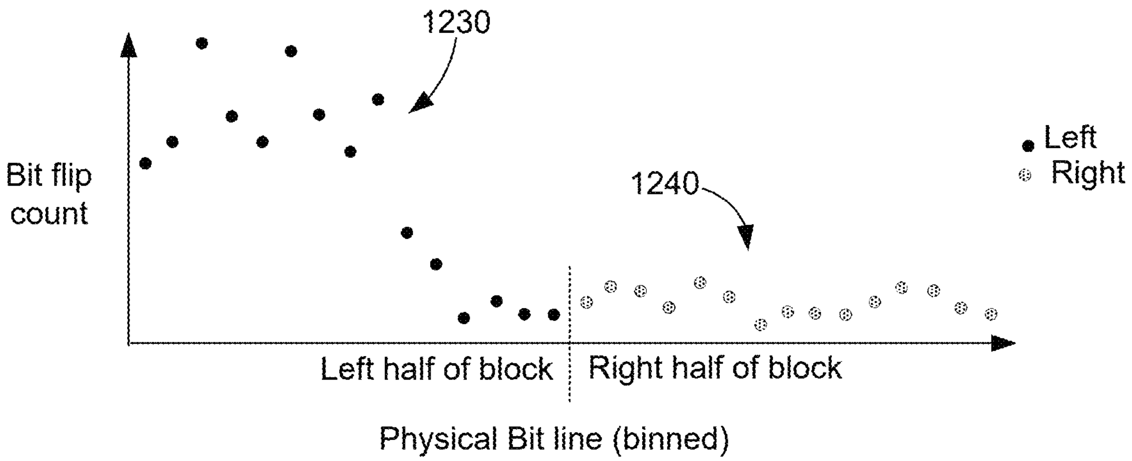
FIG. 12B shows counts of bit flips versus physical bit lines

FIGS. 12A and 12B are graphs showing further examples of how the memory system can determine whether there is a physical defect in a block following a successful read retry. FIGS. 12A and 12B pertain to an example in which there is a physical defect such as a word line to memory hole short in the block. FIG. 12A shows counts of bit flips versus logical bit lines. FIG. 12B shows counts of bit flips versus physical bit lines. In each case, the bit lines are "binned," wherein the bit flip count is for a group (bin) of bit lines. FIGS. 12A and 12B correspond to an architecture such as in FIG. 10B in which there are two word line drivers for the block. Thus, the memory cells are divided into those physically in the left half of the block and physically in the right half of the block. For example, the memory cells are divided into those physically connected to left segments of the word lines in the block and physically in the right segments of the word lines in the block. In FIG. 12A, the black dots 1210 in are the bit flip counts for the left half of the block and the lighter colored dots 1220 in are the bit flip counts for the right half of the block. In general, the bit line bins in the left half of the block have higher bit flip counts. However, simply analyzing the bit flips for logical bit lines does not reveal the physical defect. However, in FIG. 12B, the black dots 1230 in are the bit flip counts for the left half of the block and the lighter colored dots 1240 in are the bit flip counts for the right half of the block. Some of the bit line bins in the left half of the block have very high bit flip counts. Moreover, bit line bins in the right half of the block have low bit flip counts. In an embodiment, the memory controller 120 determines a first total of the bit flips for the left side of the block and a second total of the bit flips for the right side of the block. Then, the memory controller 120 determines whether the difference in bit flips between the left side and right side is greater than a specification (see, for example, Option A steps 1112, 1116 in FIG. 11). The pattern in FIG. 12B is representative of a physical defect (e.g., word line to memory hole short) in the left half of the block.

Figure 13:
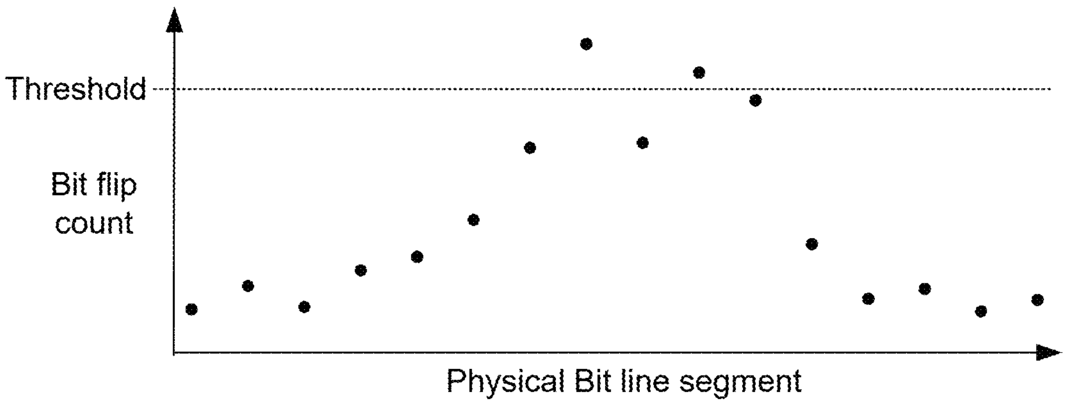
FIG. 13 is a graph showing an example of how the memory system can determine whether there is a physical defect in a block following a successful read retry.

FIG. 13 is a graph showing an example of how the memory system can determine whether there is a physical defect in a block following a successful read retry. FIG. 13 pertain to an example in which there is a physical defect such as a word line to memory hole short in the block. FIG. 13 shows counts of bit flips versus physical bit line segments. In this example there are 16 physical bit line segments. Each data point is the number of bit flips for that physical bit line segment. FIG. 13 corresponds to an architecture such as in FIG. 9 in which there is a single word line driver for the block. The memory controller 120 determines whether any of the physical bit line segments have a bit flip count above the threshold. If so, then the memory controller 120 determines that there is a physical defect in the block.

In view of the foregoing, an embodiment includes an apparatus comprising one or more control circuits configured to control a three-dimensional memory structure having blocks containing non-volatile memory cells. The one or more control circuits are configured to perform a read retry of a group of the memory cells responsive to a failure of a read of the group of memory cells. The read retry uses a different read technique than the read. The one or more control circuits are configured to determine whether a physical defect exists in a block containing the group of memory cells responsive to the read retry succeeding in reading data from the group of memory cells.

In a further embodiment of the apparatus, determining whether a physical defect exists in the block comprises the one or more control circuits determining that a physical defect exists in the block responsive to a determination that errors in the failure of the read are clustered in a region of the block containing a subgroup of the group of the memory cells.

In a further embodiment of the apparatus, determining whether a physical defect exists in the block comprises the one or more control circuits comparing first read results using first read reference levels that were used in the read that failed with second read results from a successful read retry of the group of memory cells with second read reference levels.

In a further embodiment of the apparatus, determining whether a physical defect exists in the block comprises the one or more control circuits determining which memory cells in the group have a different result in the second read results than the first read results, the different result being a bit flip. The one or more control circuits determine that a physical defect exists in the block responsive to a determination that a first number of bit flips for memory cells in a first physical region of the block is more than a threshold amount greater than a second number of bit flips for memory cells in a second physical region of the block.

In a further embodiment of the apparatus, the first physical region includes those memory cells connected to a first segment of a word line in the block and the second physical region includes those memory cells connected to a second segment of the word line.

In a further embodiment, the apparatus further comprises a first word line driver configured to drive the first segment of the word line and a second word line driver configured to drive to the second segment of the word line.

In a further embodiment of the apparatus, determining whether a physical defect exists in the block comprises the one or more control circuits determining which memory cells in the group have a different result in the second read results than the first read results, the different result being a bit flip. The one or more control circuits determine that a physical defect exists in the block responsive to a determination that a number of bit flips for a physically contiguous subgroup of the group of memory cells is greater than a threshold.

In a further embodiment of the apparatus, the one or more control circuits are configured to retire the block containing the group of the memory cells responsive to a determination that a physical defect exists in the block. The one or more control circuits continue to use the block responsive to a determination that the failure of the read was due to an intrinsic reliability issue as opposed to a physical defect in the block.

In a further embodiment of the apparatus the memory cells comprise NAND memory cells.

An embodiment includes a method for operating NAND memory. The method comprises determining that a read error has occurred when reading a group of NAND memory cells in a block at a first set of read reference levels. The method comprises determining a second set of read reference levels that are able to successfully read the group of NAND memory cells in response to the read error at the first set of read reference levels. The method comprises determining whether the read error is due to a physical defect in the block or intrinsic memory cell reliability based on differences at a memory cell level between first results of reading the group at the first set of read reference levels and second results of reading the group at the second set of read reference levels.

An embodiment includes a non-volatile storage system comprising a three-dimensional memory structure having blocks containing NAND memory cells and one or more control circuits in communication with the three-dimensional memory structure. The one or more control circuits are configured to perform one or more read retries of a group of memory cells connected to a selected word line in a block in the three-dimensional memory structure responsive to a read error using a first set of read reference levels to read the group until a second set of read reference levels are found that succeed in reading the group of memory cells. The one or more control circuits are configured to determine whether there is a physical defect in the block based on physical locations of memory cells having a different result when reading the group at the second set of the read reference levels than reading the group at the first set of the read reference levels. The one or more control circuits are configured to retire the block responsive to a determination that there is the physical defect in the block.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects. For example, a "set of reference voltages" may contain one or more reference voltages.

For purposes of this document, the term "subgroup" means less than all of a group of two or more objects. For example, a "subgroup of memory cells" contains less than all of the group of memory cells.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits configured to control a three-dimensional memory structure having blocks containing word lines and non-volatile memory cells, the one or more control circuits configured to:

perform a read retry of a group of the memory cells responsive to a failure of a read of the group of memory cells, wherein the read retry uses a different read technique than the read that failed, wherein the group of the memory cells is connected to a selected word line in a selected block; and determine whether a physical defect exists in the selected block responsive to the read retry succeeding in reading data from the group of memory cells, including determining that the physical defect exists in the selected block responsive to a determination that errors in the read that failed are clustered in a subgroup of the memory cells located at a physical segment of the selected word line.

2. The apparatus of claim 1, wherein determining whether a physical defect exists in the selected block comprises the one or more control circuits:

comparing first read results using first read reference levels that were applied to the selected word line in the read that failed with second read results from a successful read retry of the group of memory cells with second read reference levels applied to the selected word line.

3. The apparatus of claim 2, wherein determining whether a physical defect exists in the selected block comprises the one or more control circuits:

determining which memory cells in the group have a different result in the second read results than the first read results, the different result being a bit flip; and determining that a physical defect exists in the block responsive to a determination that a first number of bit flips for memory cells located at a first physical segment of the selected word line is more than a threshold amount greater than a second number of bit flips for memory cells located at a second physical segment of the selected word line.

4. The apparatus of claim 1, further comprising:

a first word line driver configured to drive the first physical segment of the selected word line, wherein a first half of a page of the group of the memory cells are located at the first physical segment; and a second word line driver configured to drive to-the second physical segment of the selected word line, wherein a second half of the page of the group of the memory cells are located at the second physical segment.

5. The apparatus of claim 2, wherein determining whether a physical defect exists in the block comprises the one or more control circuits:

determining which memory cells in the group have a different result in the second read results than the first read results, the different result being a bit flip; and determining that a physical defect exists in the block responsive to a determination that a number of bit flips for a physically contiguous subgroup of the group of memory cells is greater than a threshold.

6. The apparatus of claim 1, wherein the one or more control circuits are configured to:

retire the block containing the group of the memory cells responsive to a determination that a physical defect exists in the block; and continue to use the block responsive to a determination that the failure of the read was due to an intrinsic reliability issue as opposed to a physical defect in the block.

7. The apparatus of claim 1, wherein the non-volatile memory cells comprise NAND memory cells.

8. A method for operating NAND memory, the method comprising:

determining that a read error has occurred when reading a page of NAND memory cells connected to a word line in a block at a first set of read reference levels;

determining a second set of read reference levels that are able to successfully read the page of NAND memory cells in response to the read error at the first set of read reference levels; and determining that the read error is due to a physical defect in the block responsive to differences in reading the page of the NAND memory cells at the first set of read reference levels and the second set of read reference levels being localized to a sub-group of the page of memory cells located at a physical segment of the word line.

9. The method of claim 8, wherein determining that the read error is due to a physical defect in the block comprises:

determining whether differences in reading the page of the NAND memory cells at the first set of read reference levels and second set of read reference levels are:

i) localized to a first portion of the page of memory cells located at a first physical segment of the word line; or ii) randomly distributed across the page of the NAND memory cells.

10. The method of claim 9, further comprising:

determining that the read error is due to a physical defect responsive to the differences being localized to the first portion of the page of memory cells located at the first physical segment of the word line.

11. The method of claim 8, wherein determining that the read error is due to a physical defect comprises:

determining whether a first bit flip rate in first memory cells located at a first physical segment of the word line is more than a threshold amount greater than a second bit flip rate in second memory cells located at a second physical segment of the word line.

12. The method of claim 8, wherein determining that the read error is due to a physical defect in the block comprises:

determining whether a bit flip rate of a physically contiguous subgroup of the memory cells in the page of memory cells is greater than a threshold.

13. A non-volatile storage system comprising:

a three-dimensional memory structure having blocks containing word lines and NAND memory cells; and one or more control circuits in communication with the three-dimensional memory structure, the one or more control circuits configured to:

perform one or more read retries of a group of memory cells connected to a selected word line in a block in the three-dimensional memory structure responsive to a read error using a first set of read reference levels to read the group until a second set of read reference levels are found that succeed in reading the group of memory cells;

determine whether there is a physical defect in the block based on physical locations of memory cells having a different result when reading the group at the second set of the read reference levels than reading the group at the first set of the read reference levels, including determine which memory cells in the group have a different result when reading the group at the second set of the read reference levels than reading the group at the first set of the read reference levels, the different result being a bit flip, and determine that the physical defect exists in the block responsive to a determination that a first number of the bit flips for memory cells located at a first physical segment of the selected word line is more than a threshold amount greater than a second number of the bit flips for memory cells located at a second physical segment of the selected word line different than the first physical segment; and retire the block responsive to a determination that the physical defect exists in the block.

14. The non-volatile storage system of claim 13, further comprising:

a first word line driver connected to and driving the first physical segment of the selected word line; and a second word line driver connected to and driving the second physical segment of the selected word line.

15. The non-volatile storage system of claim 13, wherein the one or more control circuits configured to:

determine the number of bit flips for memory cells at each of a plurality of physical segments along the selected word line; and determine that a physical defect exists in the block responsive to a determination that at least one of the plurality of physical segments has a number of bit flips greater than a threshold.

* * * * *